US012347689B2

(12) United States Patent
Hsiao et al.

(10) Patent No.: US 12,347,689 B2
(45) Date of Patent: Jul. 1, 2025

(54) SEMICONDUCTOR DEVICE AND METHODS OF FORMATION

(71) Applicant: Taiwan Semiconductor Manufacturing Company, Ltd., Hsinchu (TW)

(72) Inventors: Hsu Ming Hsiao, Hsinchu (TW); Hong Pin Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 638 days.

(21) Appl. No.: 17/651,103

(22) Filed: Feb. 15, 2022

(65) Prior Publication Data

US 2023/0260790 A1 Aug. 17, 2023

(51) Int. Cl.
| | | |
|---|---|---|
| *H01L 21/311* | (2006.01) | |
| *H01L 21/28* | (2025.01) | |
| *H10D 30/01* | (2025.01) | |
| *H10D 30/62* | (2025.01) | |
| *H10D 64/01* | (2025.01) | |
| *H10D 64/66* | (2025.01) | |

(52) U.S. Cl.
CPC .. *H01L 21/28088* (2013.01); *H01L 21/31116* (2013.01); *H10D 30/024* (2025.01); *H10D 30/6211* (2025.01); *H10D 64/015* (2025.01); *H10D 64/017* (2025.01); *H10D 64/667* (2025.01)

(58) Field of Classification Search
CPC ......... H01L 21/28088; H01L 21/31116; H01L 29/66795; H01L 29/66553; H01L 29/6653
See application file for complete search history.

(56) References Cited

U.S. PATENT DOCUMENTS

| | | | |
|---|---|---|---|
| 10,797,174 B2 | 10/2020 | Chang et al. | |
| 11,695,055 B2 | 7/2023 | Peng et al. | |
| 11,728,407 B2 | 8/2023 | Wang | |
| 2007/0281105 A1* | 12/2007 | Mokhlesi | ................ C23C 16/40 427/569 |

(Continued)

FOREIGN PATENT DOCUMENTS

| | | |
|---|---|---|
| TW | 202009995 A | 3/2020 |
| TW | 202135145 A | 9/2021 |
| TW | 202145320 A | 12/2021 |

*Primary Examiner* — Walter H Swanson
*Assistant Examiner* — Jacob T Nelson
(74) *Attorney, Agent, or Firm* — Harrity & Harrity, LLP

(57) ABSTRACT

Spacer layers on sidewalls of a dummy gate structure included in a semiconductor device are trimmed or etched prior to or during a replacement gate process in which the dummy gate structure is replaced with a replacement gate structure. A radical surface treatment operation is performed to etch the spacer layers, which is a type of plasma treatment in which radicals are generated using a plasma. The radicals in the plasma are used to etch the spacer layers such that the shape and/or the geometry of the remaining portions of the spacer layers reduces, minimizes, and/or prevents the likelihood of an antenna defect being formed in the spacer layers and/or in a work function metal layer of the replacement gate structure. This reduces, minimizes, and/or prevents the likelihood of occurrence of damage and/or defects in the replacement gate structure in subsequent processing operations for the semiconductor device.

19 Claims, 35 Drawing Sheets

(56) References Cited

U.S. PATENT DOCUMENTS

| | | | |
|---|---|---|---|
| 2012/0319205 A1* | 12/2012 | Hempel | H01L 21/823842 |
| | | | 257/E27.06 |
| 2014/0353734 A1* | 12/2014 | Xie | H01L 21/28088 |
| | | | 257/288 |
| 2016/0372566 A1* | 12/2016 | Chang | H01L 21/28008 |
| 2018/0323270 A1* | 11/2018 | Hsieh | H01L 29/42376 |
| 2019/0067006 A1* | 2/2019 | Hawrylchak | H01J 37/32724 |
| 2020/0343362 A1* | 10/2020 | Wu | H01L 29/6653 |
| 2021/0320181 A1 | 10/2021 | Wang et al. | |

* cited by examiner

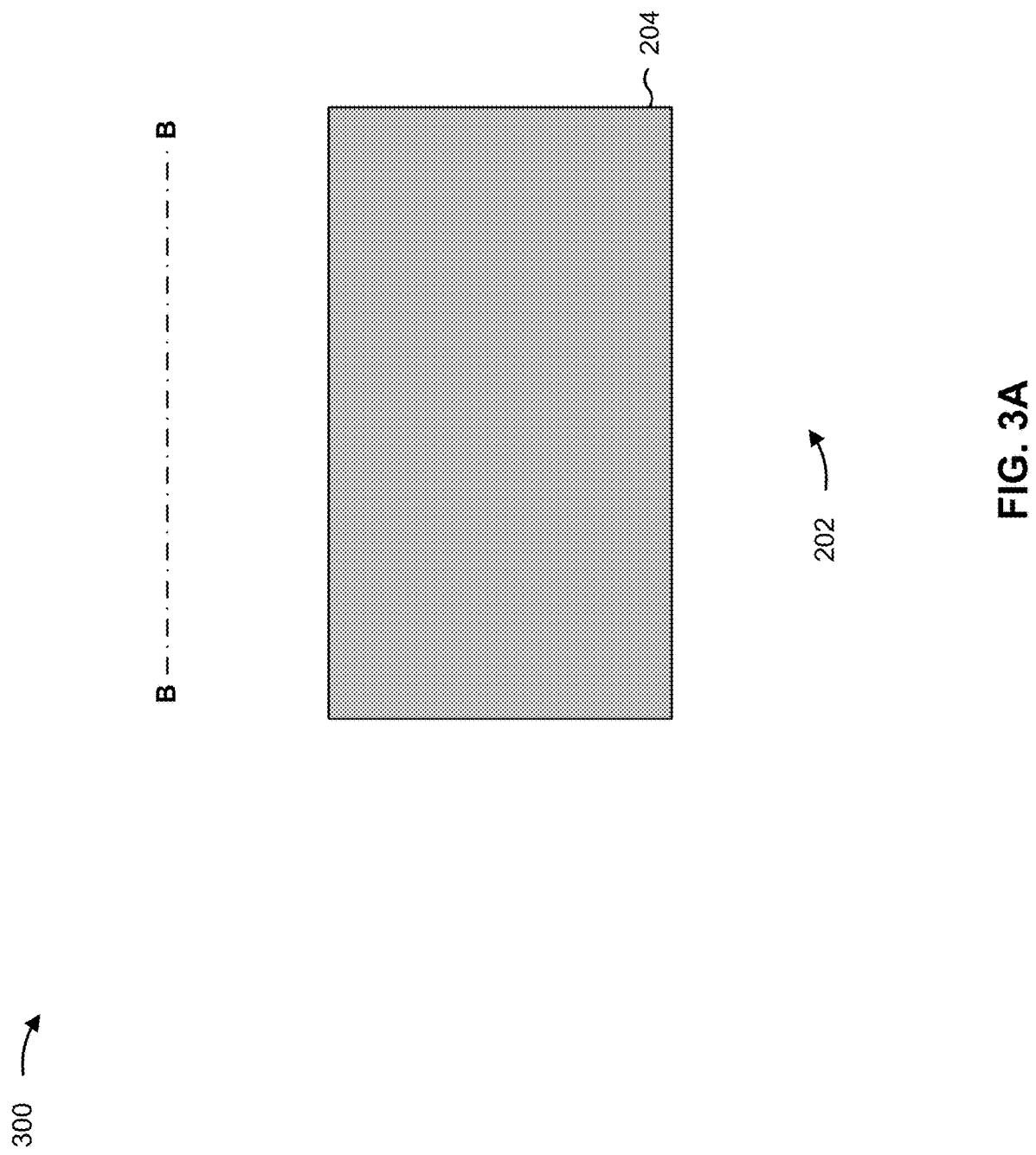

SEMICONDUCTOR DEVICE AND METHODS OF FORMATION

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D, 4A-4C, 5A-5O, and 6A-6H are diagrams of one or more example implementations described herein.

DETAILED DESCRIPTION

Figure 1:
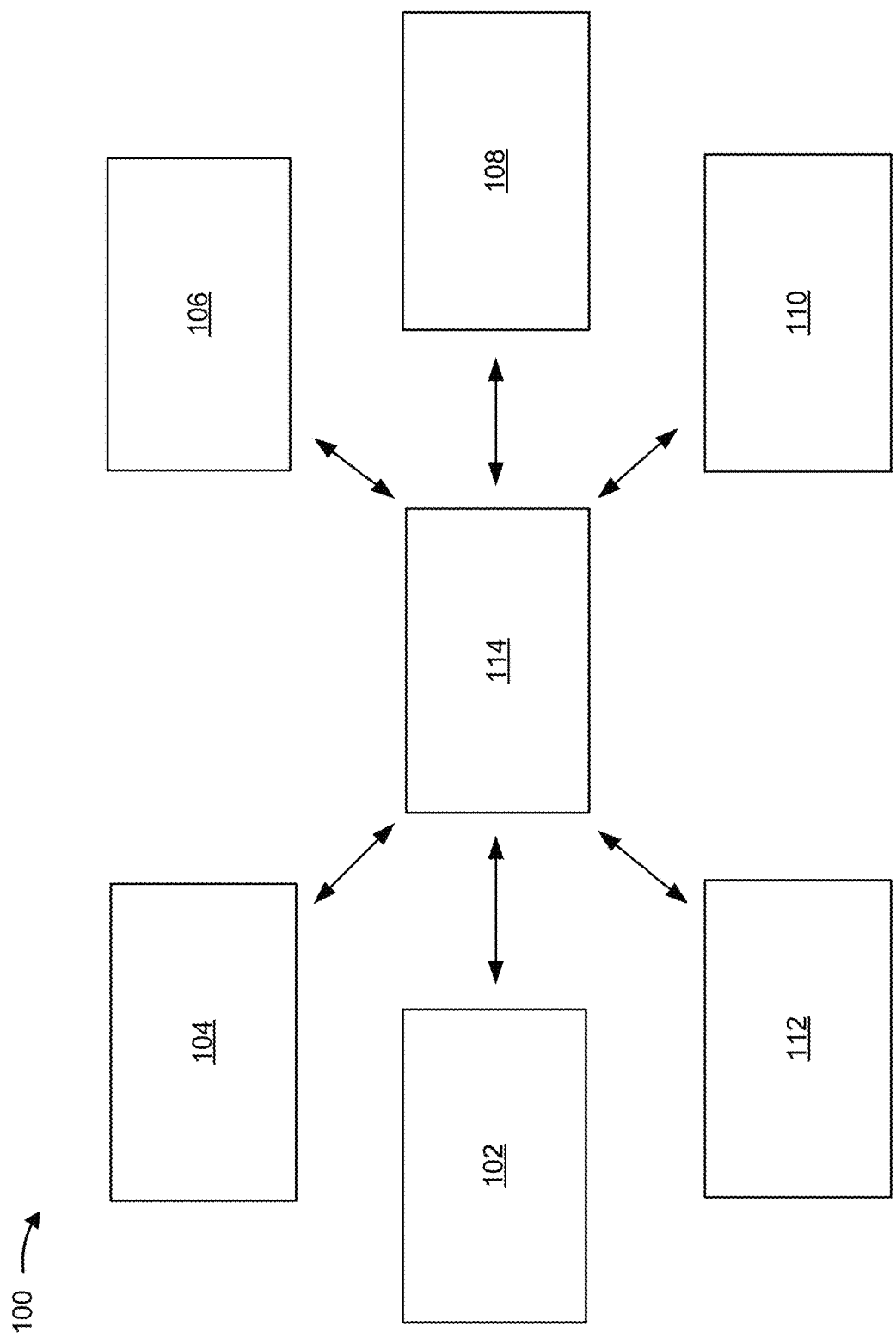
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, damage and/or defects can occur in a layer or structure during processing of a semiconductor device. Particular shapes and/or geometries of structures included in a semiconductor device can increase the likelihood of damage and/or defect formation. As an example, damage and/or defects can occur in a gate structure of a transistor (e.g., a fin field effect transistor (finFET) or another type of transistor) during formation of a gate contact (or gate interconnect) as a result of the geometry and/or shape of one or more layers and/or structures of the gate structure. An upward and outward angle (referred to as an antenna defect) of a top surface of a work function metal (WFM) layer and/or a spacer layer, for example, can cause an etchant to be funneled toward a metal gate (MG) layer of the gate structure during an operation to etch a self-aligned cap (SAC) above the metal gate layer to form an opening to the metal gate layer for metal gate contact formation. The funneled etchants increase the etch rate of the metal gate layer, which can cause the metal gate layer to be fully or partially removed. This is referred to as an MG missing defect, and may result in failure of the transistor and decreased semiconductor device yield.

Some implementations described herein provide semiconductor devices and methods of formation to reduce, minimize, and/or prevent the likelihood of occurrence of antenna defects in the semiconductor devices. In some implementations, spacer layers on sidewalls of a dummy gate structure included in a semiconductor device are trimmed or etched prior to or during a replacement gate process (RGP) in which the dummy gate structure is replaced with a replacement gate structure (e.g., a metal gate structure or a high dielectric constant (high-k) gate structure). A radical surface treatment (RST) operation is performed to etch the spacer layers, which is a type of plasma treatment in which radicals are generated using a plasma. The radicals in the plasma are used to etch the spacer layers such that the shape and/or the geometry of the remaining portions of the spacer layers reduces, minimizes, and/or prevents the likelihood of an antenna defect being formed in the spacer layers and/or in a work function metal layer of the replacement gate structure. This reduces, minimizes, and/or prevents the likelihood of occurrence of damage and/or defects in the replacement gate structure in subsequent processing operations for the semiconductor device. This reduces the likelihood of defect formation in transistors included in the semiconductor device, increases reliability of the transistors included in the semiconductor device, and/or increases yield of semiconductor devices, among other examples.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
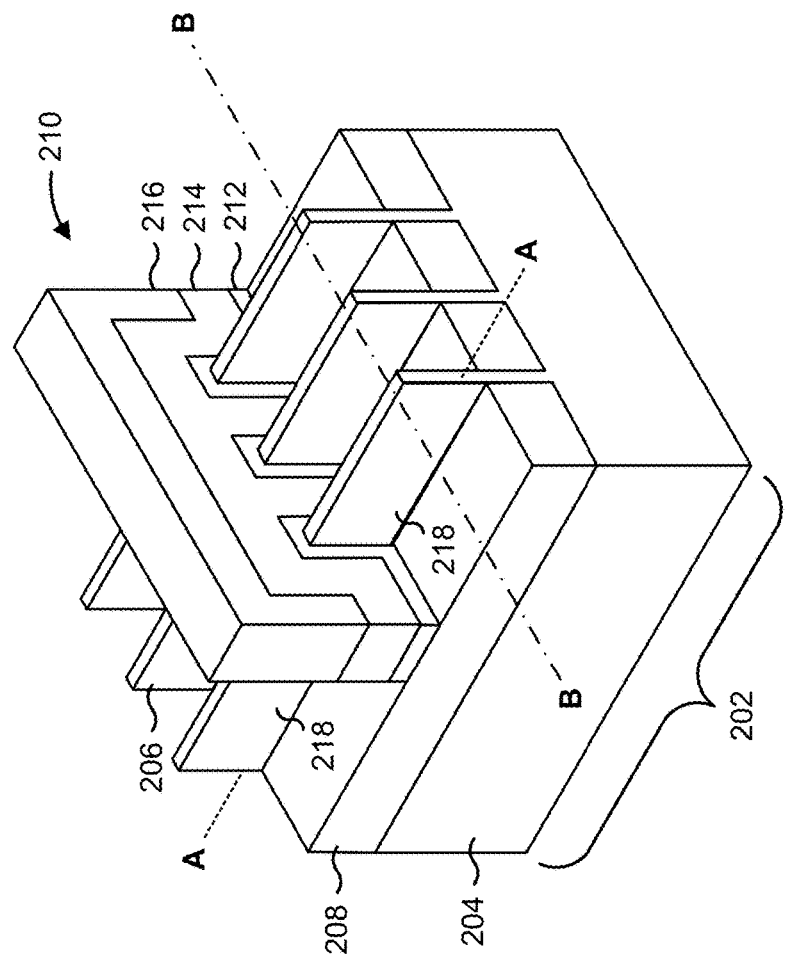
FIG. 2 is a diagram of an example semiconductor device described herein.

FIG. 2 is a diagram of example regions of a semiconductor device 200 described herein. In particular, FIG. 2 illustrates an example device region 202 of the semiconductor device 200 in which one or more transistors or other devices are included. The transistors may include fin-based transistors, such as fin field effect transistors (finFETs), nanostructure transistors, and/or other types of transistors. In some implementations, the device region 202 includes a p-type metal oxide semiconductor (PMOS) region, an n-type metal oxide semiconductor (NMOS) region, a complementary metal oxide semiconductor (CMOS) region, and/or another type of device region. FIGS. 3A-6H are schematic cross-sectional views of various portions of the device region 202 of the semiconductor device 200 illustrated in FIG. 2, and correspond to various processing stages of forming fin-based transistors in the device region 202 of the semiconductor device 200.

The semiconductor device 200 includes a substrate 204. The substrate 204 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 204 may include a round/circular substrate having an approximately 200 mm diameter, an approximately 300 mm diameter, or another diameter, such as 450 mm, among other examples. The substrate 204 may alternatively be any polygonal, square, rectangular, curved, or otherwise non-circular workpiece, such as a polygonal substrate.

Fin structures 206 are included above (and/or extend above) the substrate 204 for the device region 202. A fin structure 206 may provide an active region where one or more devices (e.g., fin-based transistors) are formed. In some implementations, the fin structures 206 include silicon (Si) materials or another elementary semiconductor material such as germanium (Ge). In some implementations, the fin structures 206 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof. In some implementations, the fin structures 206 are doped using n-type and/or p-type dopants.

The fin structures 206 are fabricated by suitable semiconductor process techniques, such as masking, photolithography, and/or etch processes, among other examples. As an example, the fin structures 206 may be formed by etching a portion of the substrate 204 away to form recesses in the substrate 204. The recesses may then be filled with isolating material that is recessed or etched back to form shallow trench isolation (STI) regions 208 above the substrate 204 and between the fin structures 206. Other fabrication techniques for the STI regions 208 and/or for the fin structures 206 may be used. The STI regions 208 may electrically isolate adjacent active areas in the fin structures 206. The STI regions 208 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 208 may include a multi-layer structure, for example, having one or more liner layers.

A dummy gate structure 210 (or a dummy gate stack 210) is included in the device region 202 over the fin structures 206 (e.g., approximately perpendicular to the fin structures 206). The dummy gate structure 210 engages the fin structures 206 on three or more sides of the fin structures 206. In the example depicted in FIG. 2, the dummy gate structure 210 includes a gate dielectric layer 212, a gate electrode layer 214, and a hard mask layer 216. In some implementations, the dummy gate structure 210 further includes a capping layer, one or more spacer layers, and/or another suitable layer. The various layers of the dummy gate structure 210 may be formed by suitable deposition techniques and patterned by suitable photolithography and etching techniques.

The term, "dummy", as described here, refers to a sacrificial stack which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process. Accordingly, the configuration of the semiconductor device 200 illustrated in FIG. 2 may include an intermediate configuration, and additional semiconductor processing operations may be performed for the semiconductor device 200 to further process the semiconductor device 200.

The gate dielectric layer 212 may include a dielectric oxide layer. The dielectric oxide layer may be formed by chemical oxidation, thermal oxidation, ALD, CVD, and/or other suitable methods. The gate electrode layer 214 may include a polysilicon (PO) material or another suitable material. The gate electrode layer 214 may be formed by suitable deposition processes such as LPCVD or PECVD, among other examples. The hard mask layer 216 may include any material suitable to pattern the gate electrode layer 214 with particular features/dimensions on the substrate 204.

In some implementations, the various layers of the dummy gate structure 210 are first deposited as blanket layers. Then, the blanket layers are patterned through a process including photolithography and etching processes, removing portions of the blanket layers and keeping the remaining portions over the STI regions 208 and the fin structures 206 to form the dummy gate structure 210.

Source/drain areas 218 are disposed in opposing regions of the fin structures 206 with respect to the dummy gate structure 210. The source/drain areas 218 include areas in the device region 202 in which source/drain regions are to be formed. The source/drain regions in the device region 202 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the device region 202 may include PMOS transistors that include p-type source/drain regions, NMOS transistors that include n-type source/drain regions, and/or other types of transistors.

Some source/drain regions may be shared between various transistors in the device region 202. In some implementations, various ones of the source/drain regions may be connected or coupled together such that fin-based transistors in the device region 202 are implemented as two functional transistors. For example, if neighboring (e.g., as opposed to opposing) source/drain regions are electrically connected, such as through coalescing the regions by epitaxial growth (e.g., neighboring source/drain regions, as opposed to on opposing sides of the dummy gate structure 210, being coalesced), two functional transistors may be implemented. Other configurations in other examples may implement other numbers of functional transistors.

FIG. 2 further illustrates reference cross-sections that are used in later figures, including FIGS. 3A-6H. Cross-section A-A is in a plane along a channel in a fin structure 206 between opposing source/drain areas 218. Cross-section B-B is in a plane perpendicular to cross-section A-A, and is across a source/drain area 218 in fin structure 206. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

Figure 3B:
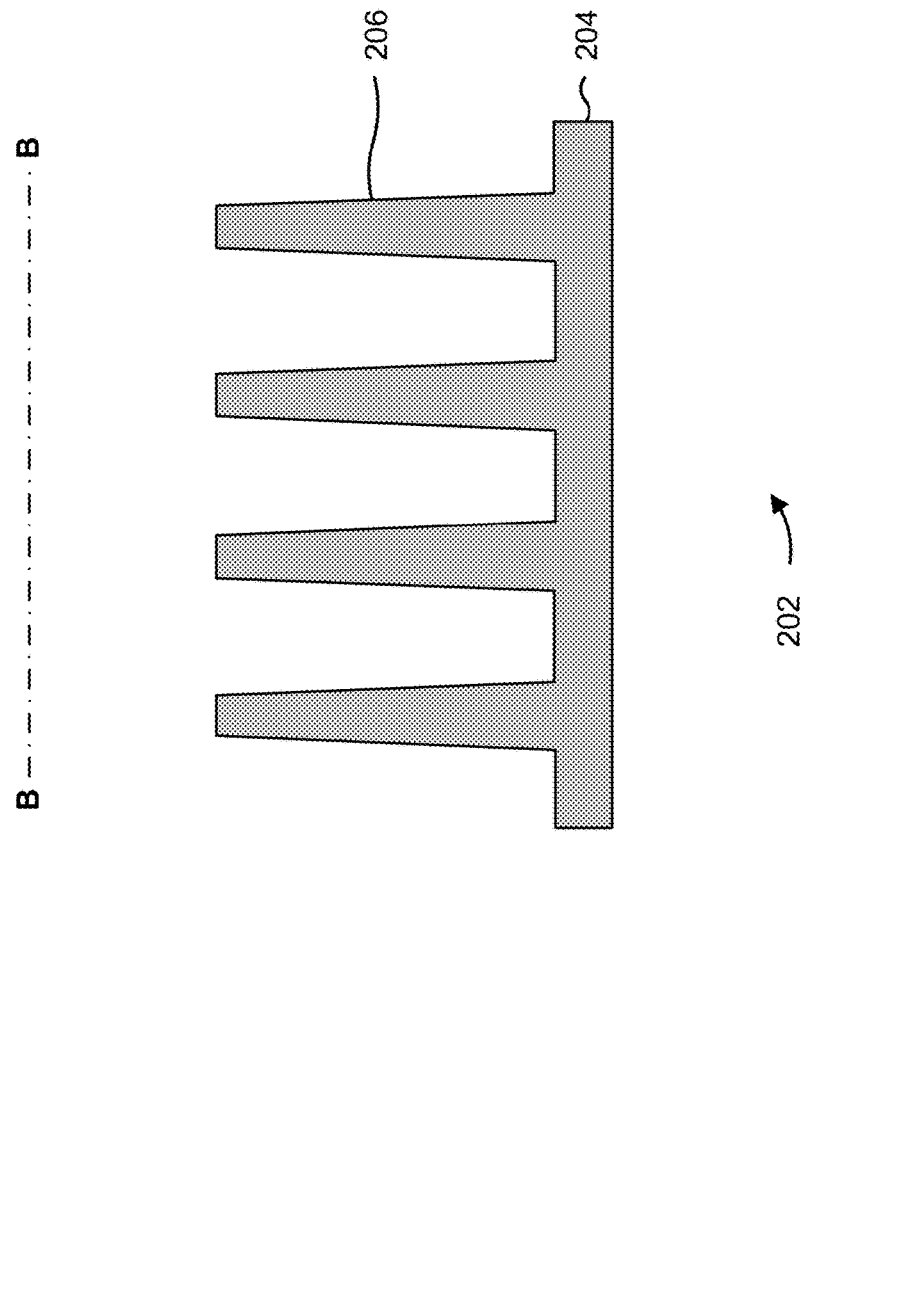

FIGS. 3A-3D are diagrams of an example implementation 300 described herein. The example implementation 300 includes an example of forming fin structures 206 for transistors in the device region 202 of the semiconductor device 200. FIGS. 3A-3D are illustrated from the perspective of the cross-sectional plane B-B in FIG. 2 for the device region 202. Turning to FIG. 3A, the example implementation 300 includes semiconductor processing operations relating to the substrate 204 in and/or on which transistors are formed in the device region 202.

As shown in FIG. 3B, the fin structures 206 are formed in the substrate 204 in the device region 202. In some implementations, a pattern in a photoresist layer is used to form the fin structures 206. In these implementations, the deposition tool 102 forms the photoresist layer on the substrate 204. The exposure tool 104 exposes the photoresist layer to a radiation source to pattern the photoresist layer. The developer tool 106 develops and removes portions of the photoresist layer to expose the pattern. The etch tool 108 etches into the substrate 204 to form the fin structures 206. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 206 based on a pattern.

Figure 3C:
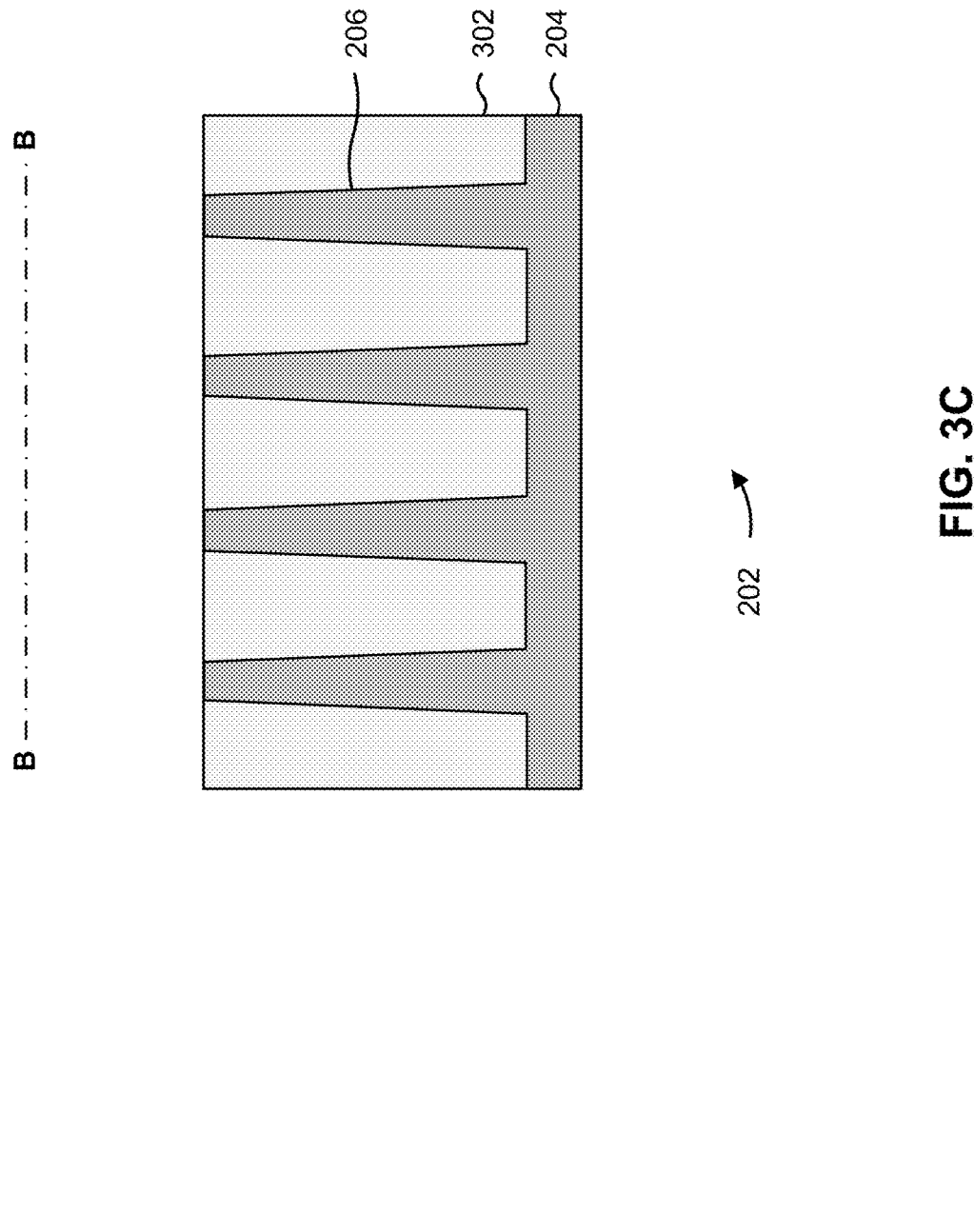

As shown in FIG. 3C, an STI layer 302 is formed in between the fin structures 206. The deposition tool 102 deposits the STI layer 302 using a CVD technique, a PVD technique, an ALD technique, a deposition technique described above in connection with FIG. 1, and/or another deposition technique. In some implementations, the STI layer 302 is formed to a height that is greater than the height of the fin structures 206. In these implementations, the planarization tool 110 performs a planarization (or polishing) operation to planarize the STI layer 302 such that the top surface of the STI layer 302 is substantially flat and smooth, and such that the top surface of the STI layer 302 and the top surface of the fin structures 206 are approximately the same height. The planarization operation may increase uniformity in the STI regions 208 that are formed from the STI layer 302 in a subsequent etch-back operation.

Figure 3D:
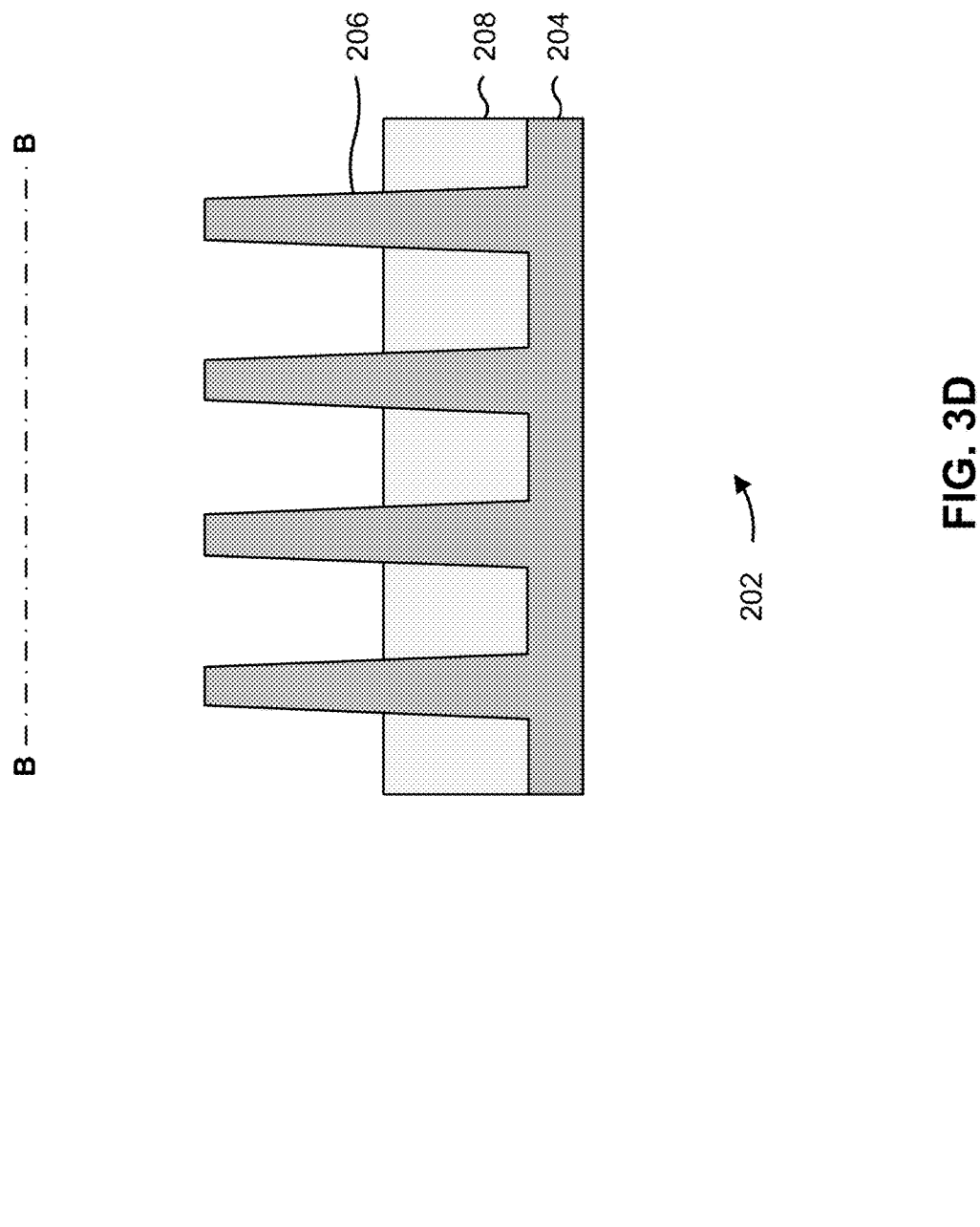

As shown in FIG. 3D, the STI layer 302 is etched in an etch back operation to expose portions of the fin structures 206. The etch tool 108 etches a portion of the STI layer 302 using a plasma etch technique, a wet chemical etch technique, and/or another type of etch technique. The remaining portions of the STI layer 302 between the fin structures 206 include the STI regions 208. In some implementations, the STI layer 302 is etched such that the height of the exposed portions of the fin structures 206 (e.g., the portions of the fin structures 206 that are above the top surface of the STI regions 208) are the same height in the device region 202. In some implementations, a first portion of the STI layer 302 in the device region 202 is etched and a second portion of the STI layer 302 in the device region 202 is etched such that the height of exposed portions of a first subset of the fin structures 206 and the height of the exposed portions of a second subset of the fin structures 206 are different, which enables the fin heights to be tuned to achieve particular performance characteristics for the device region 202.

As indicated above, FIGS. 3A-3D are provided as an example. Other examples may differ from what is described with regard to FIGS. 3A-3D.

Figure 4A:
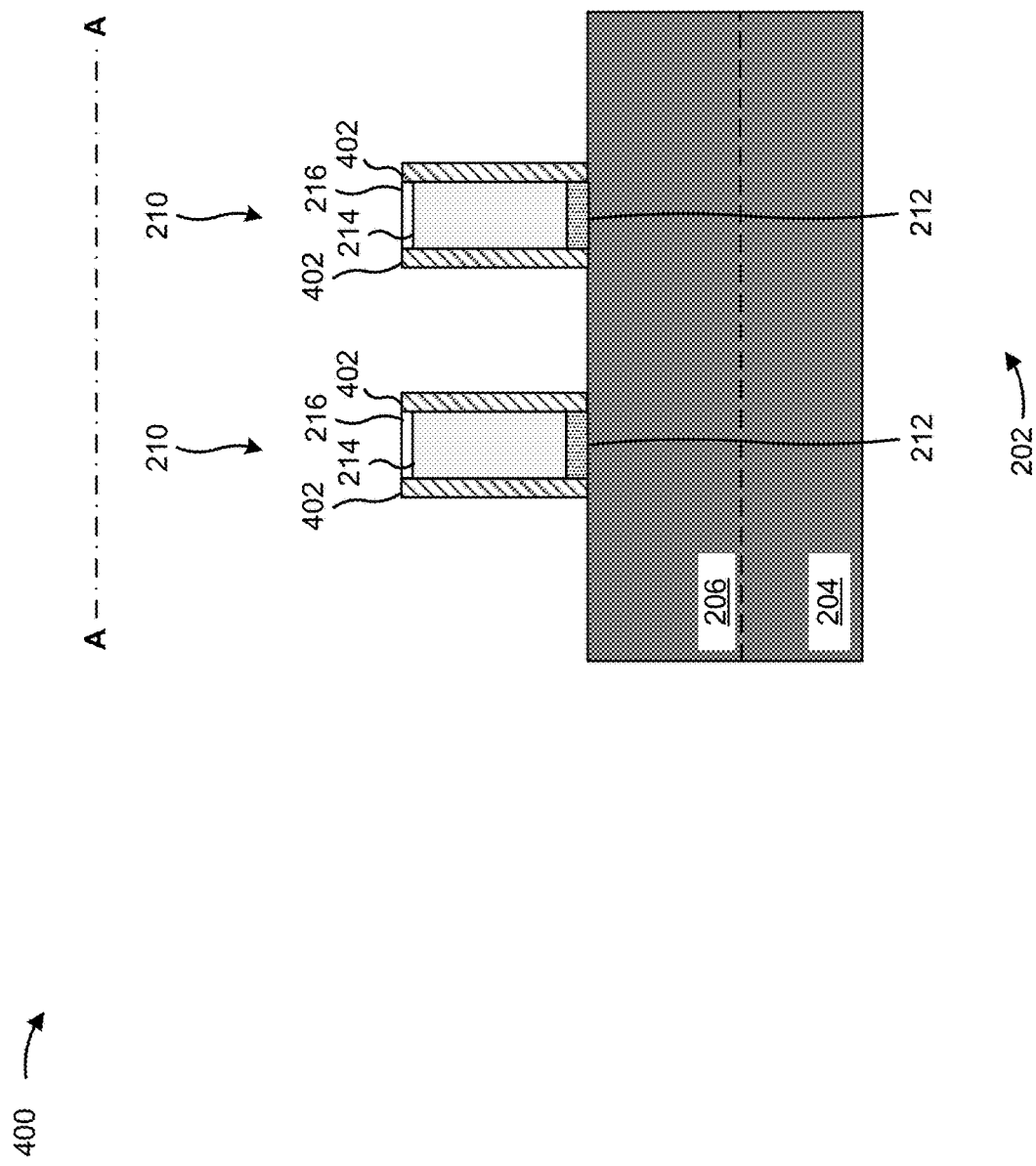
Figure 4B:
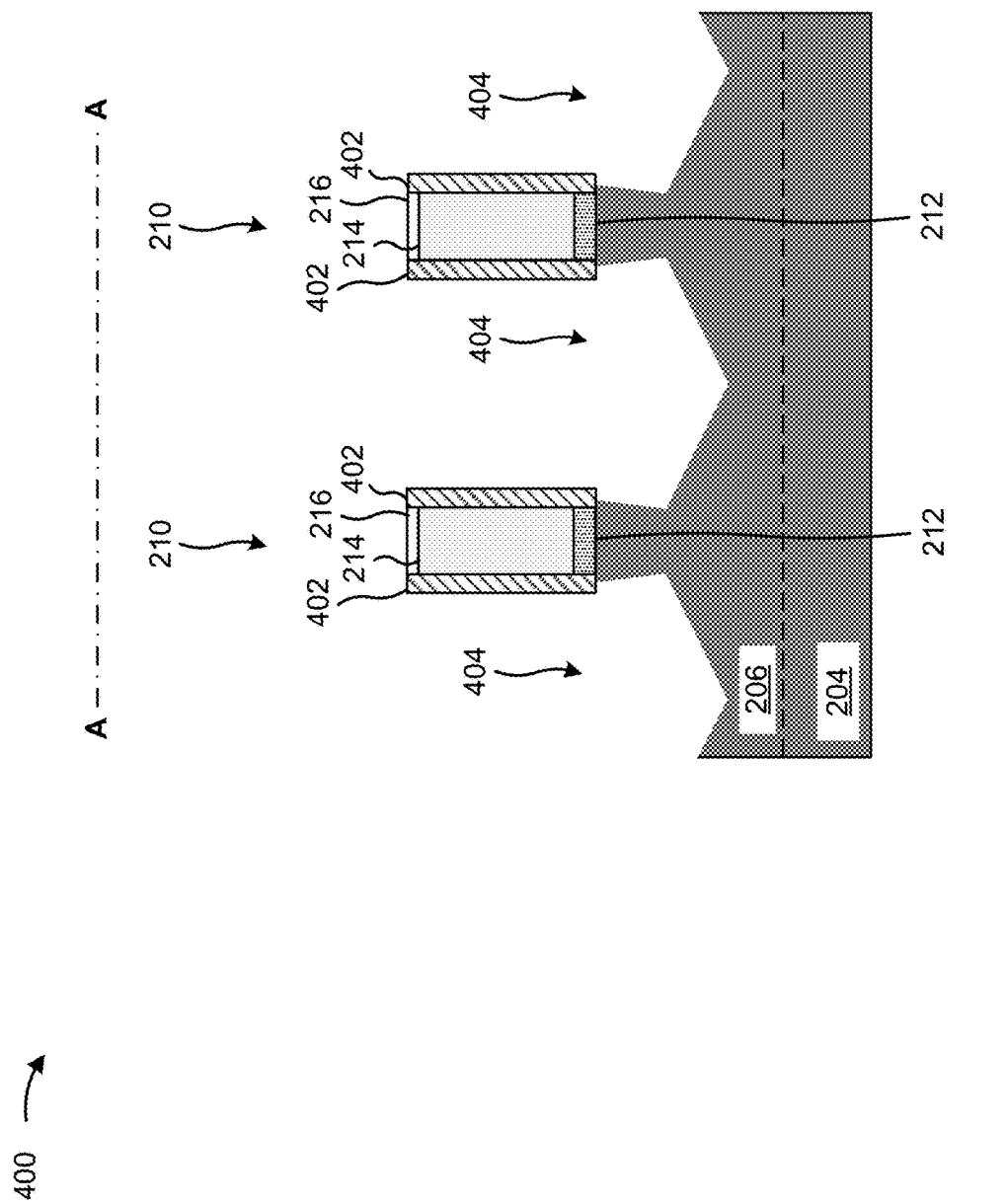
Figure 4C:
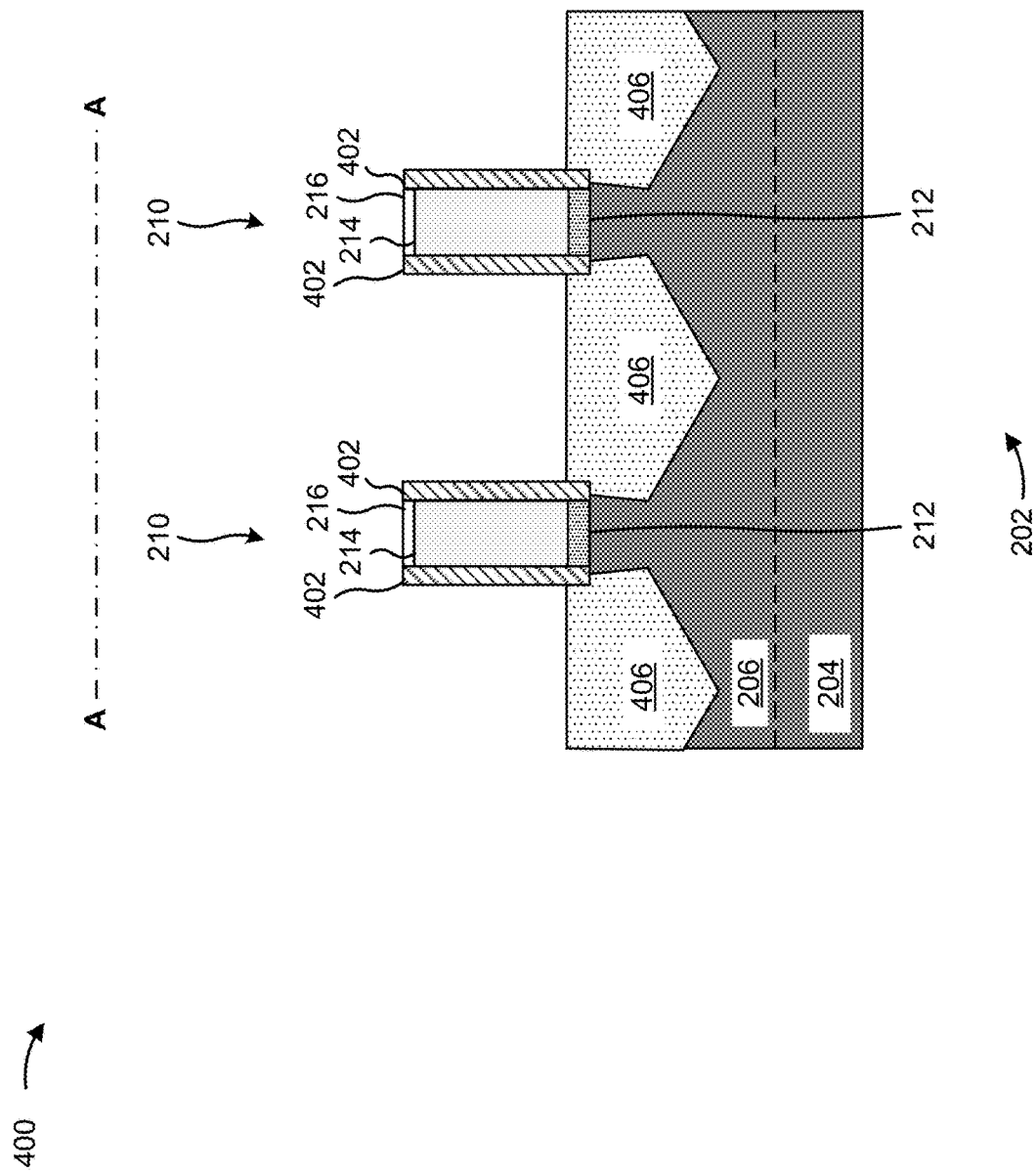

FIGS. 4A-4C are diagrams of an example implementation 400 described herein. The example implementation 400 includes an example of forming source/drain regions in the source/drain areas 218 of the device region 202 of the semiconductor device 200. FIGS. 4A-4C are illustrated from the perspective of the cross-sectional plane A-A in FIG. 2 for the device region 202. In some implementations, the operations described in connection with the example implementation 400 are performed after the fin formation process described in connection with FIGS. 3A-3D.

As shown in FIG. 4A, dummy gate structures 210 are formed in the device region 202. The dummy gate structures 210 are formed and included over the fin structures 206, and around the sides of the fin structures 206 such that the dummy gate structures 210 surround the fin structure 206 on at least three sides of the fin structure 206. The dummy gate structures 210 are formed as placeholders for the actual gate structures (e.g., replacement high-k gate structures or metal gate structures) that are to be formed for the transistors included in the device region 202. The dummy gate structures 210 may be formed as part of a replacement gate process, which enables other layers and/or structures to be formed prior to formation of the replacement gate structures.

The dummy gate structures 210 include gate dielectric layers 212, gate electrode layers 214, and hard mask layers 216. The gate dielectric layers 212 may each include dielectric oxide layers. As an example, the gate dielectric layers 212 may each be formed (e.g., by the deposition tool 102) by chemical oxidation, thermal oxidation, ALD, CVD, and/or other suitable methods. The gate electrode layers 214 may each include a poly-silicon layer or other suitable layers. For example, the gate electrode layers 214 may be formed (e.g., by the deposition tool 102) by suitable deposition processes such as LPCVD or PECVD, among other examples. The hard mask layers 216 may each include any material suitable to pattern the gate electrode layers 214 with particular dimensions and/or attributes. Examples include silicon nitride, silicon oxynitride, silicon carbon nitride, or a combination thereof, among other examples. The hard mask layers 216 may be deposited (e.g., by the deposition tool 102) by CVD, PVD, ALD, or another deposition technique.

As further shown in FIG. 4A, spacer layers 402 are included on the sidewalls of the dummy gate structures 210. The spacer layers 402 may be conformally deposited (e.g., by the deposition tool 102) and may include a silicon oxycarbide (SiOC), a nitrogen free SiOC, or another suitable material. The spacer layers 402 may be formed by an ALD operation in which various types of precursor gasses including silicon (Si) and carbon The are sequentially supplied in a plurality of alternating cycles to form the spacer layers 402, among other example deposition techniques.

In some implementations, the spacer layers 402 include a plurality of types of spacer layers. For example, the spacer layers 402 may include a seal spacer layer that is formed on the sidewalls of the dummy gate structures 210 and bulk spacer layer that is formed on the seal spacer layer. The seal spacer layer and the bulk spacer layers may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer.

In some implementations, the spacer layers 402 are conformally deposited (e.g., by the deposition tool 102) on the dummy gate structures 210, and on the fin structures 206. The spacer layers 402 are then patterned (e.g., by the deposition tool 102, the exposure tool 104, and the developer tool 106) and etched (e.g., by the etch tool 108) to remove the spacer layers 402 from tops of the dummy gate structures 210 and from the fin structures 206.

As shown in FIG. 4B, recesses 404 are formed in the fin structures 206 in the device region 202 between the dummy gate structures 210 in an etch operation. The etch operation may be performed by the etch tool 108 and may be referred to a first strained source/drain (SSD) etch operation, and the recesses 404 may be referred to as strained source/drain recesses. In some implementations, the first etch operation includes a plasma etch technique, a wet chemical etch technique, and/or another type of etch technique.

In some implementations, a plurality of etch operations are performed to form recesses 404 for different types of transistors. For example, a photoresist layer may be formed over and/or on a first portion of the fin structures 206 and over and/or on a first subset of the dummy gate structures 210 such that a second portion of the fin structures 206 between a second subset of the dummy gate structures 210 may be etched such that p-type source/drain regions and n-type source/drain regions may be formed in separate epitaxial operations.

As shown in FIG. 4C, source/drain regions 406 are formed in the recesses 404 in the device region 202 of the semiconductor device 200 over the substrate 204. The deposition tool 102 forms the source/drain regions 406 by an epitaxial operation, in which layers of the epitaxial material are deposited in the recesses 404 such that the layers of p-type source/drain regions and/or layers of n-type source/drain regions are formed by epitaxial growth in a particular crystalline orientation. The source/drain regions 406 are included between the dummy gate structures 210 and at least partially below and/or lower than the dummy gate structures 210. Moreover, the source/drain regions 406 at least partially extend above a top surface of the fin structures 206.

The material (e.g., silicon (Si), gallium (Ga), or another type of semiconductor material) that is used to form the source/drain regions 406 may be doped with a p-type dopant (e.g., a type of dopant that includes electron acceptor atoms that create holes in the material), with an n-type dopant (e.g., a type of dopant that includes electron donor atoms that create mobile electrons in the material), and/or with another type of dopant. The material may be doped by adding impurities (e.g., the p-type dopant, the n-type dopant) to a source gas that is used during the epitaxial operation. Examples of p-type dopants that may be used in the epitaxial operation include boron (B) or germanium (Ge), among other examples. The resulting material of p-type source/drain regions include silicon germanium ($Si_xGe_{1-x}$, where x can be in a range from approximately 0 to approximately 100) or another type of p-doped semiconductor material. Examples of n-type dopants that may be used in the epitaxial operation include phosphorous (P) or arsenic (As), among other examples. The resulting material of n-type source/drain regions include silicon phosphide ($Si_xP_y$) or another type of n-doped semiconductor material.

As indicated above, FIGS. 4A-4C are provided as an example. Other examples may differ from what is described with regard to FIGS. 4A-4C.

Figure 5A:
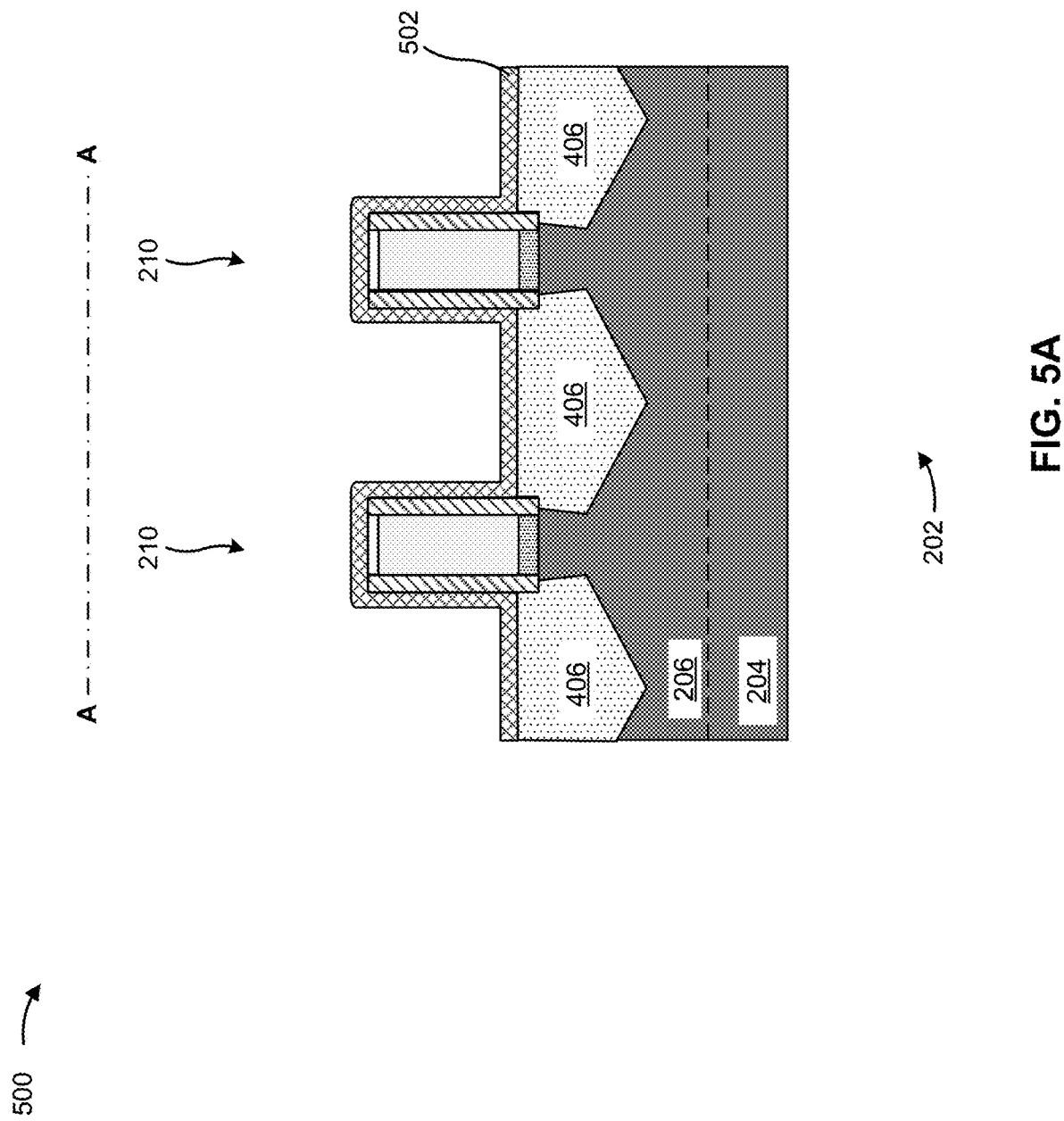
Figure 5B:
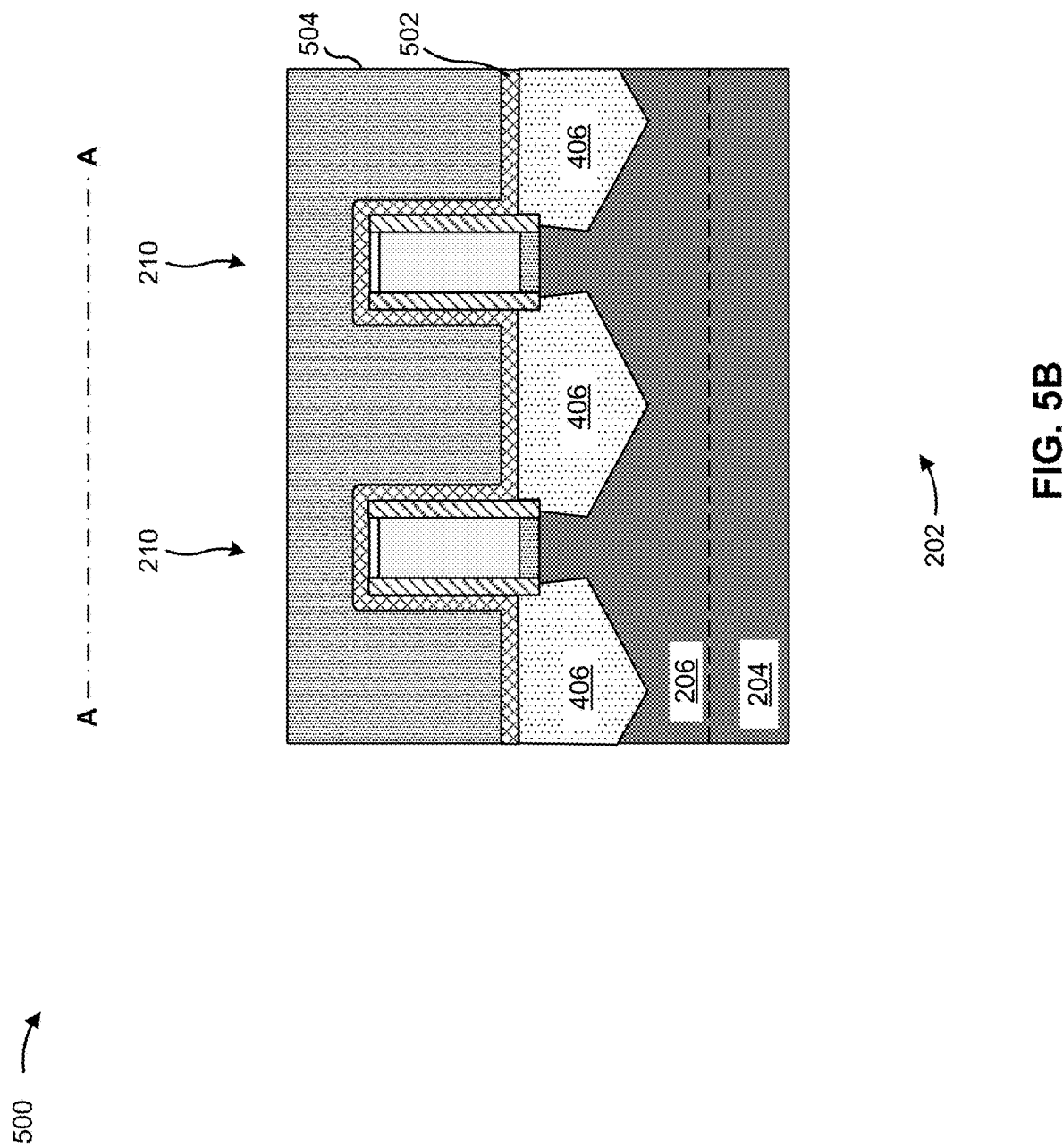
Figure 5C:
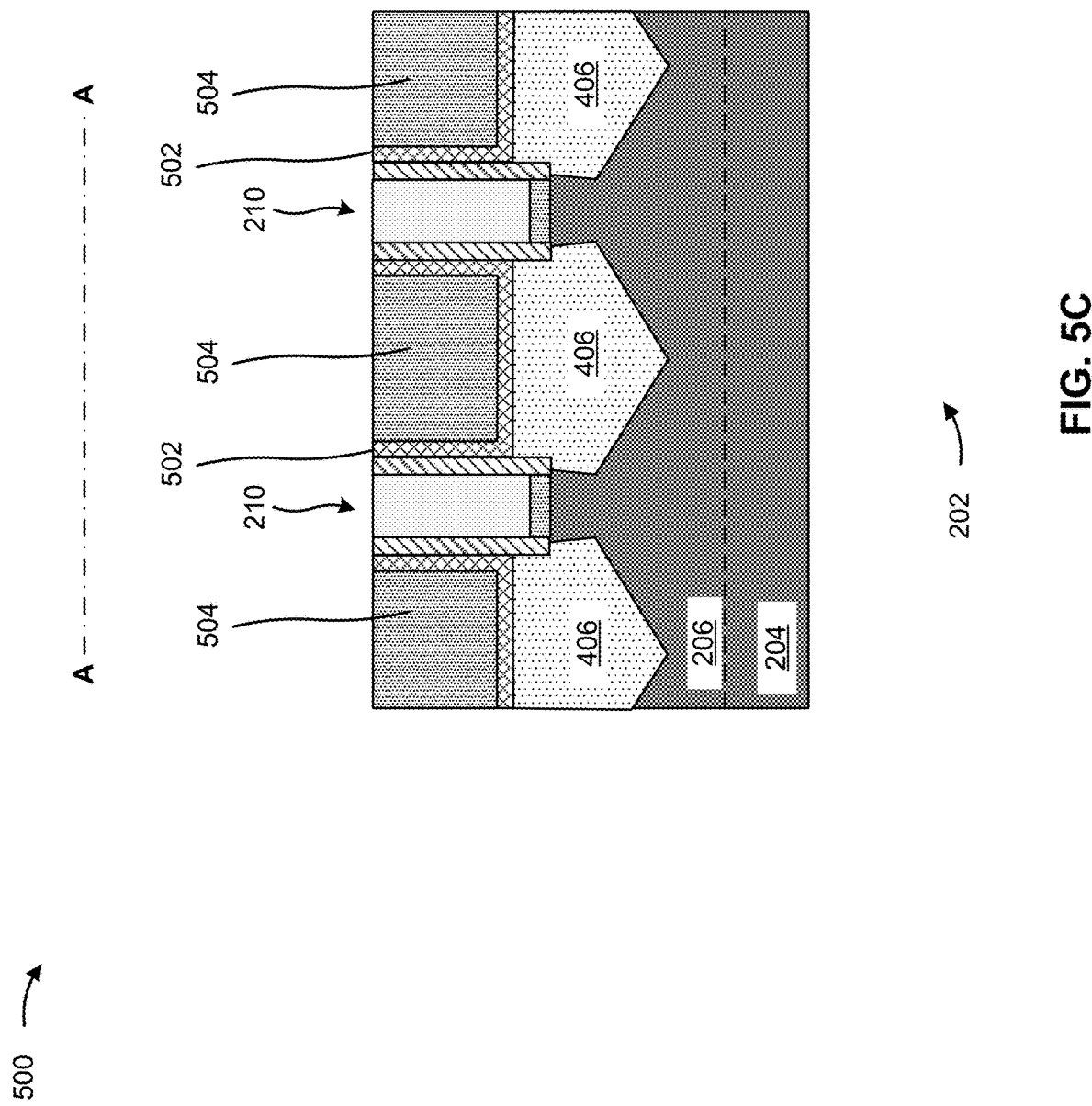
Figure 5D:
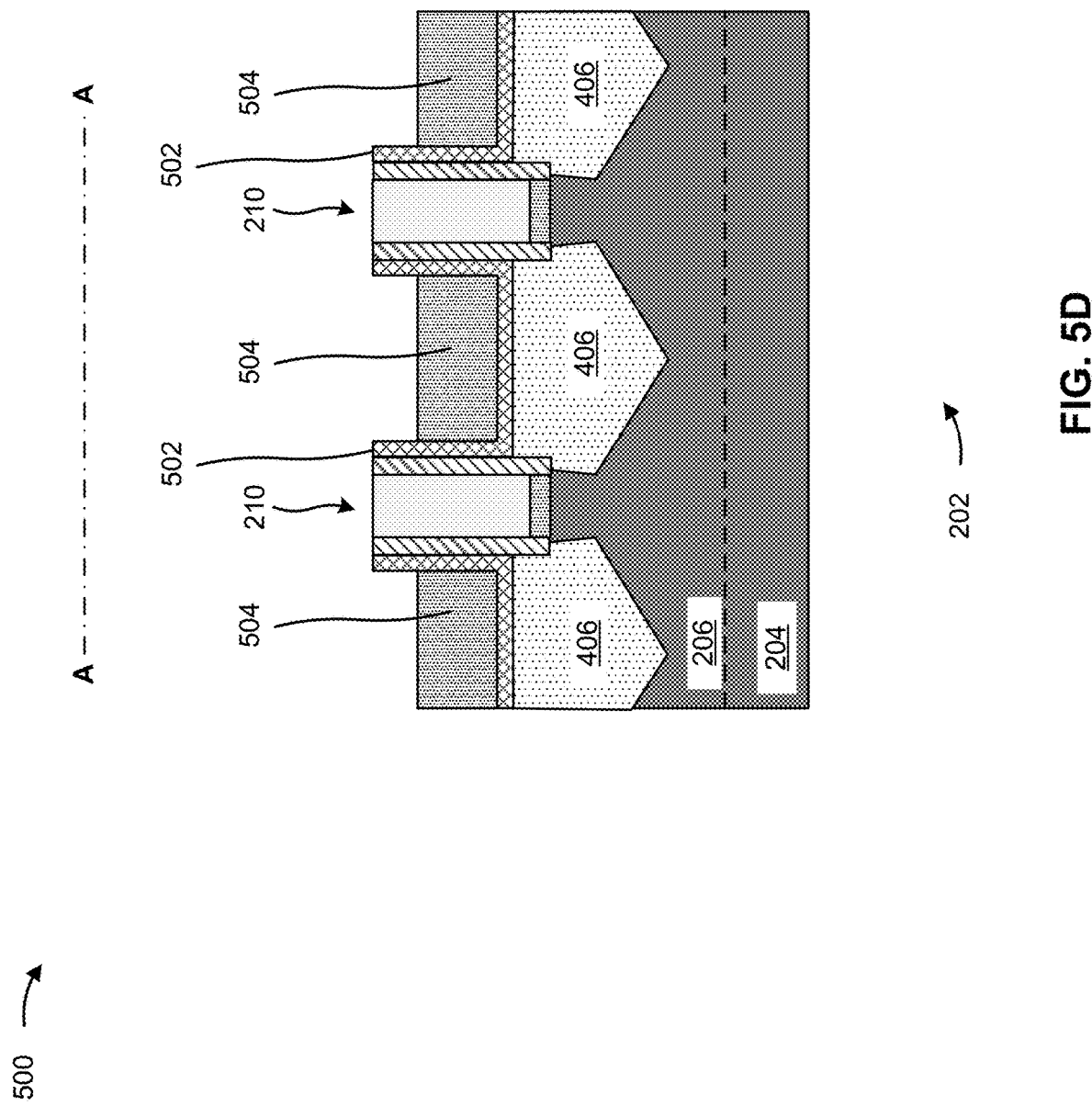
Figure 5E:
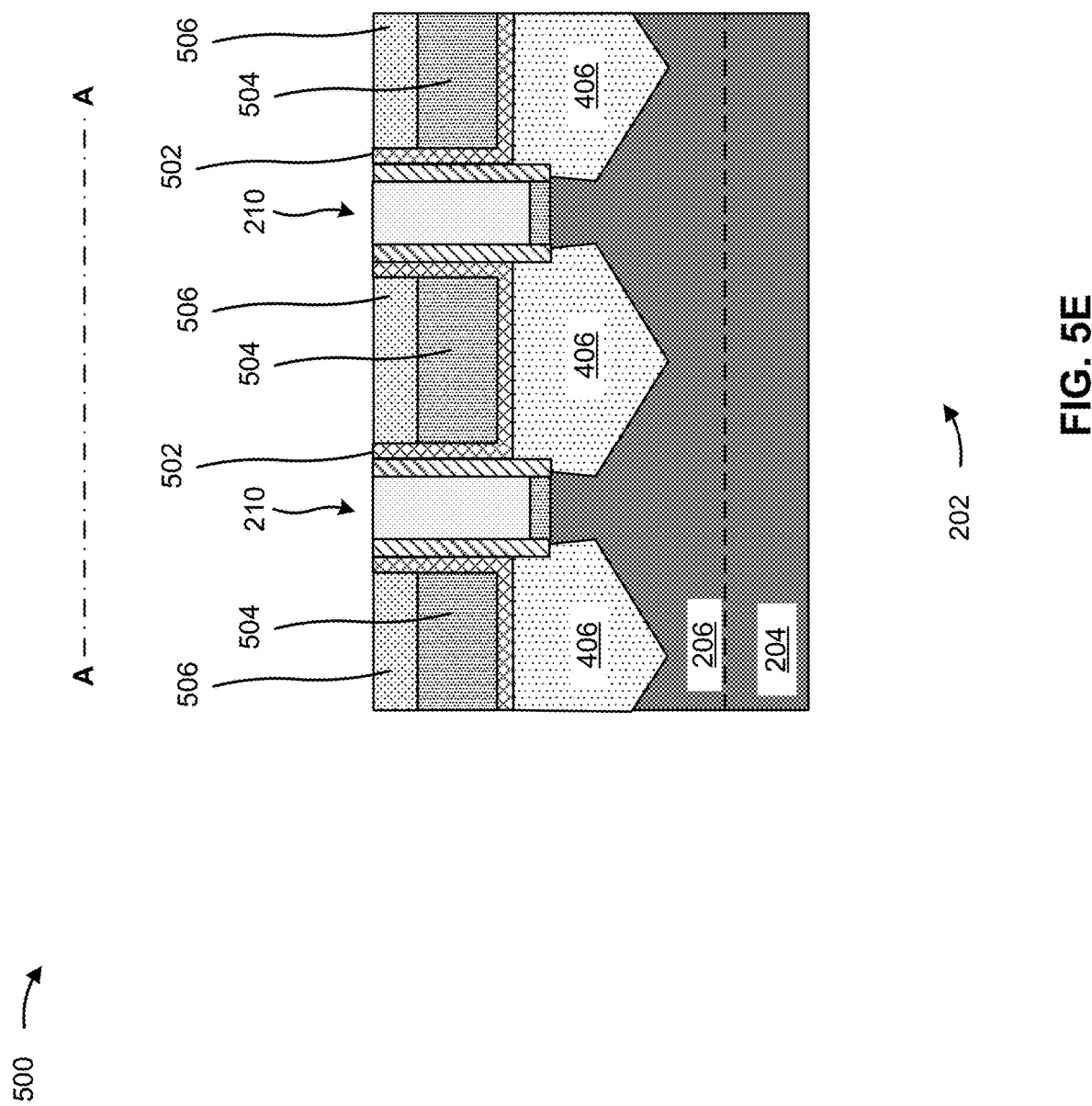
Figure 5F:
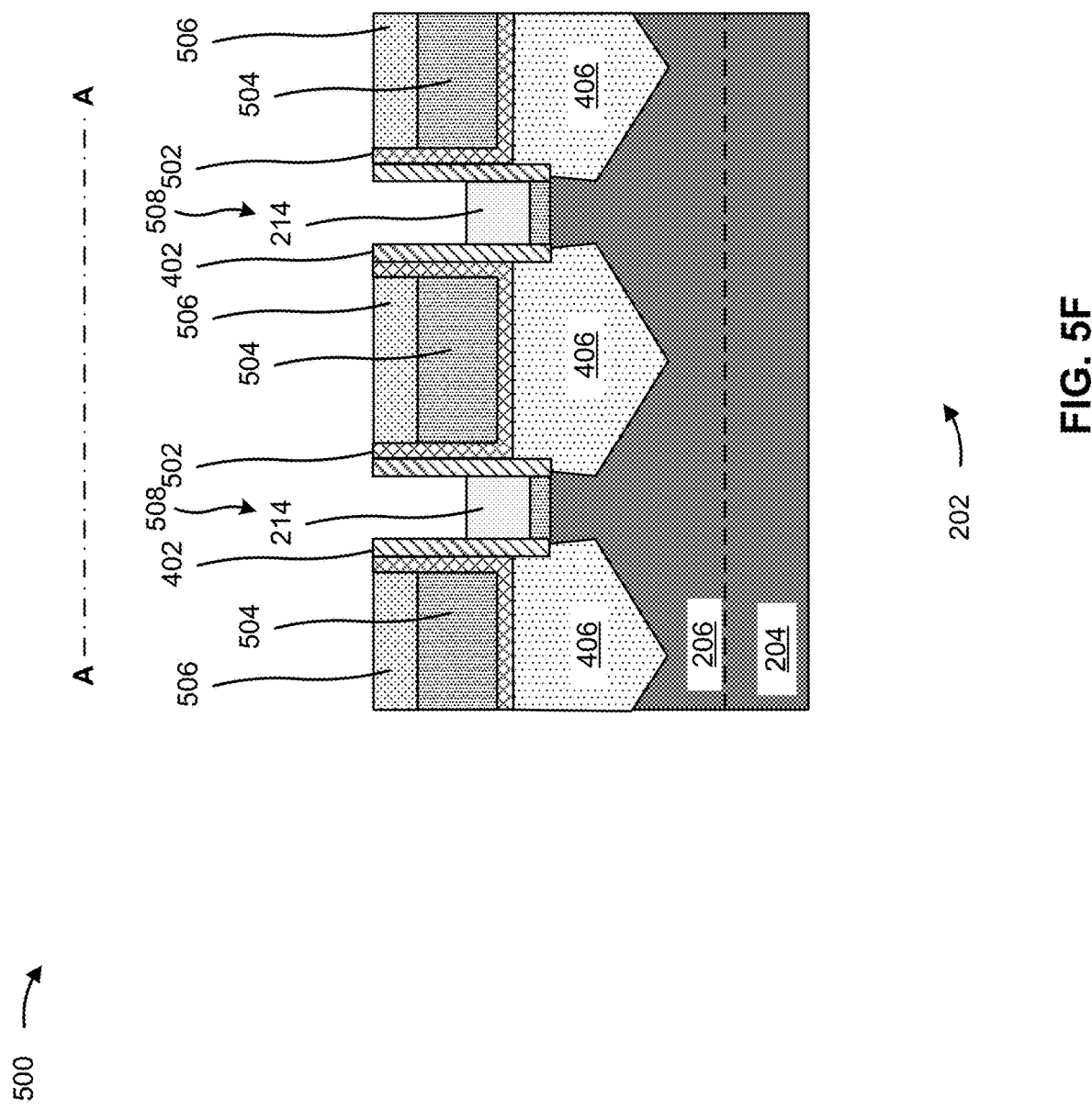
Figure 5G:
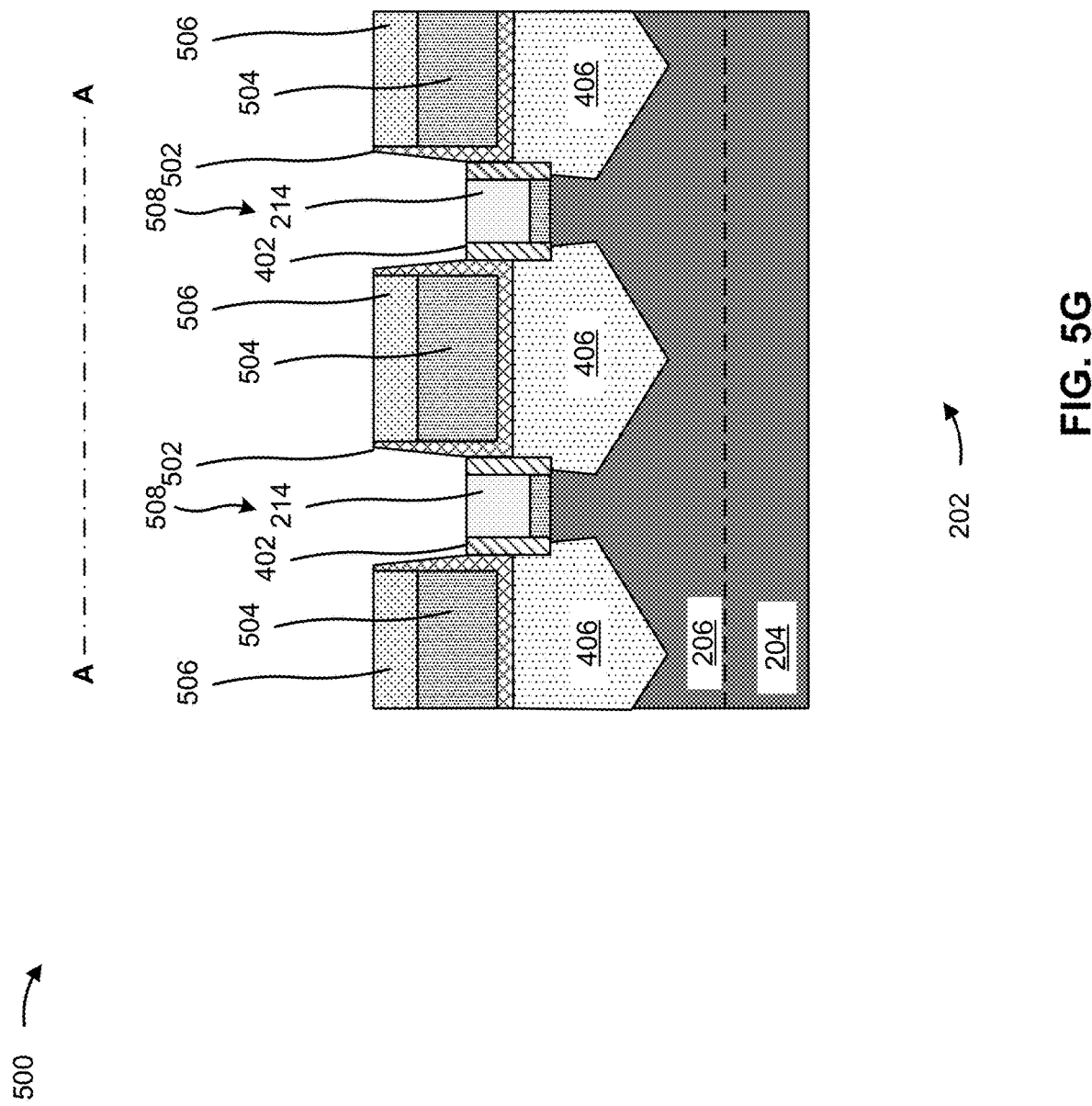
Figure 5H:
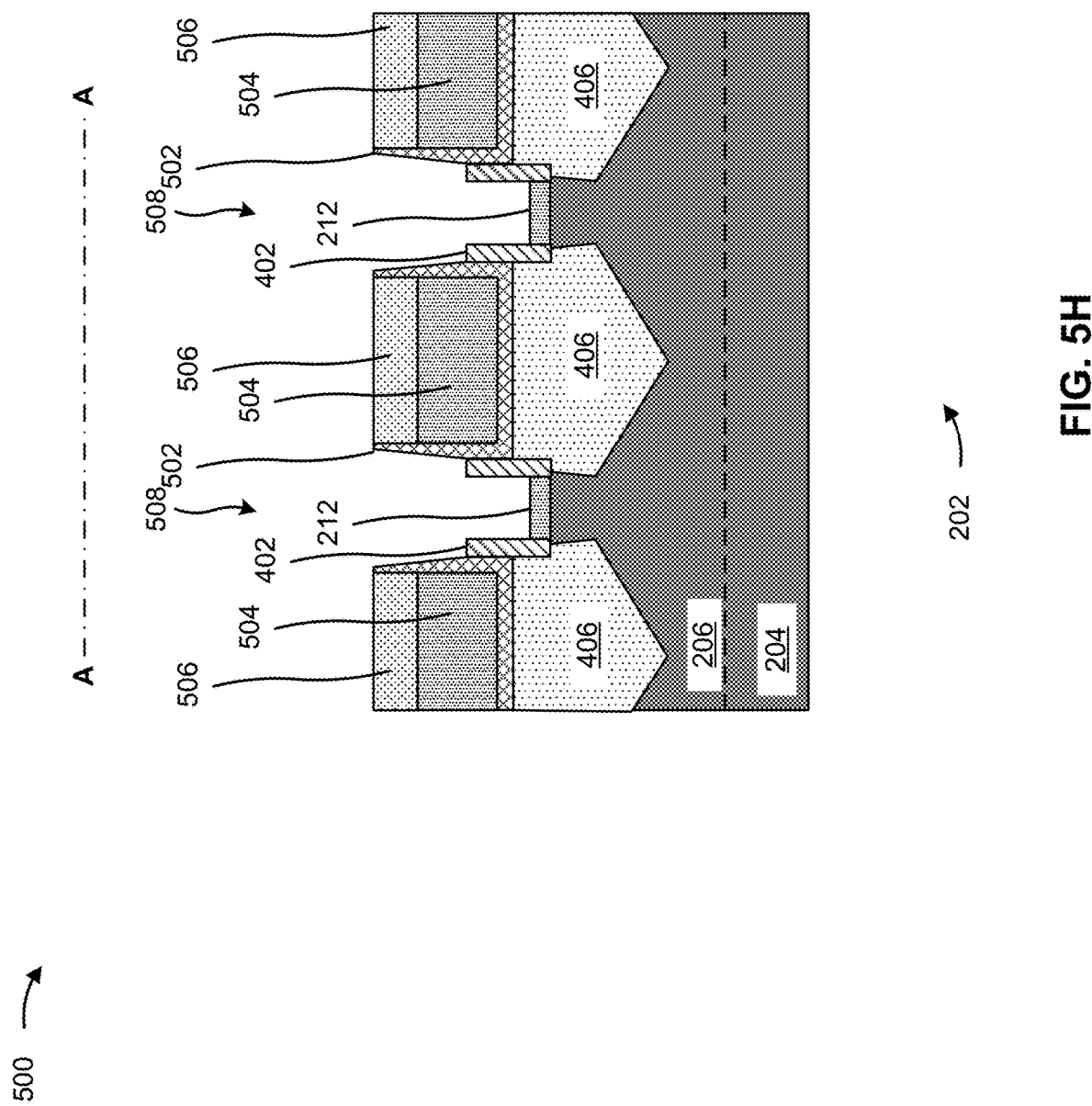
Figure 5I:
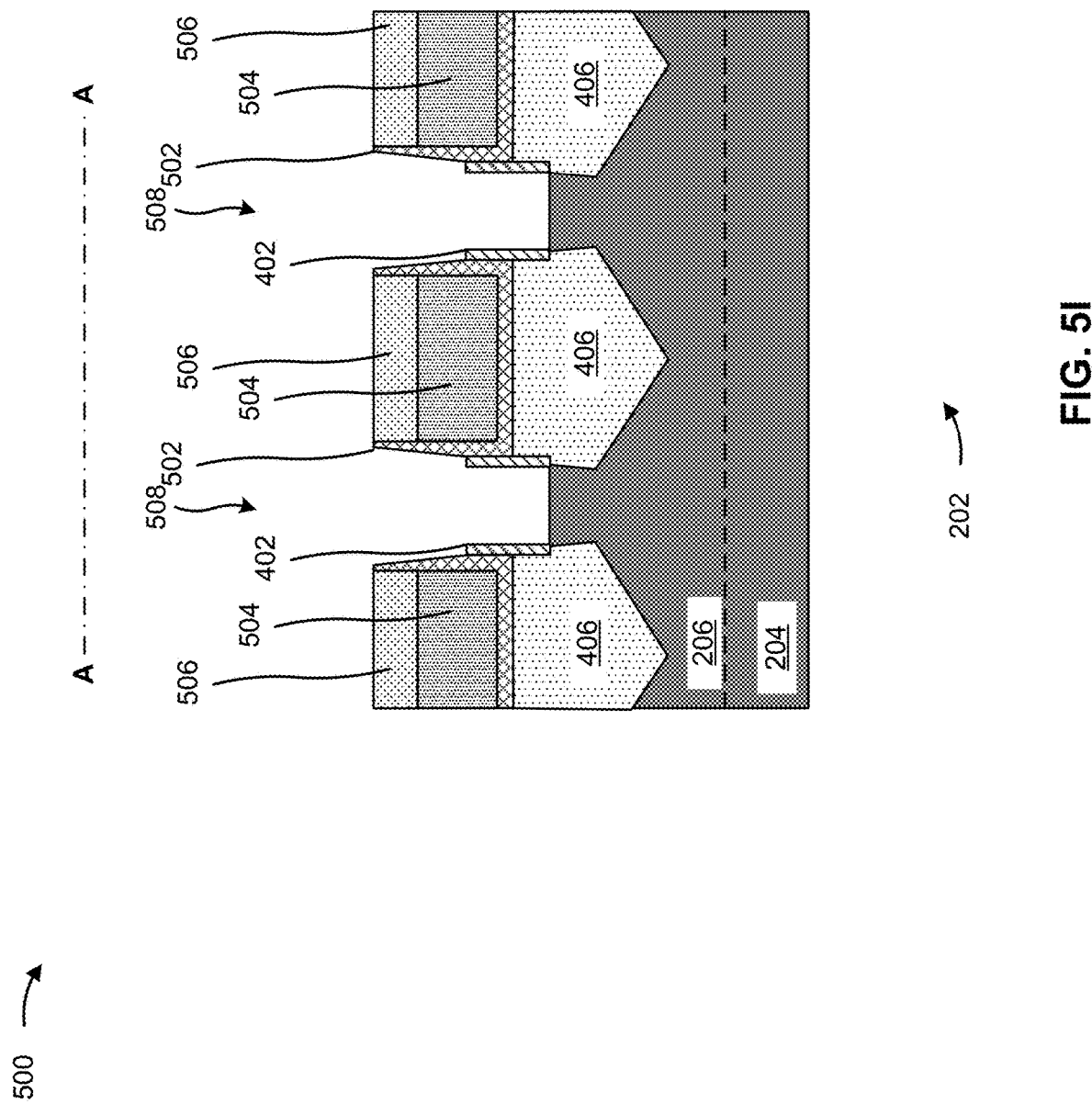
Figure 5J:
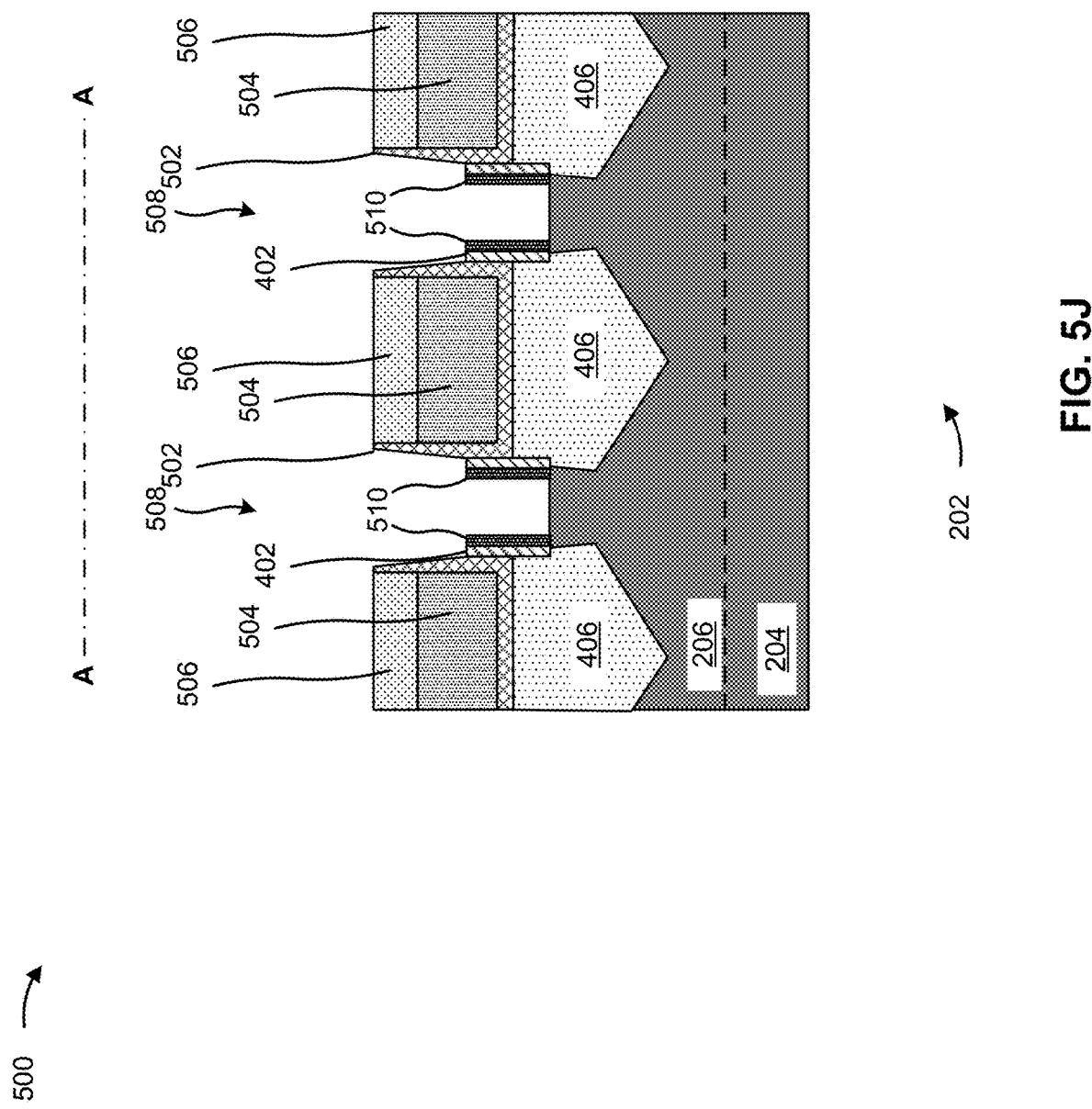
Figure 5K:
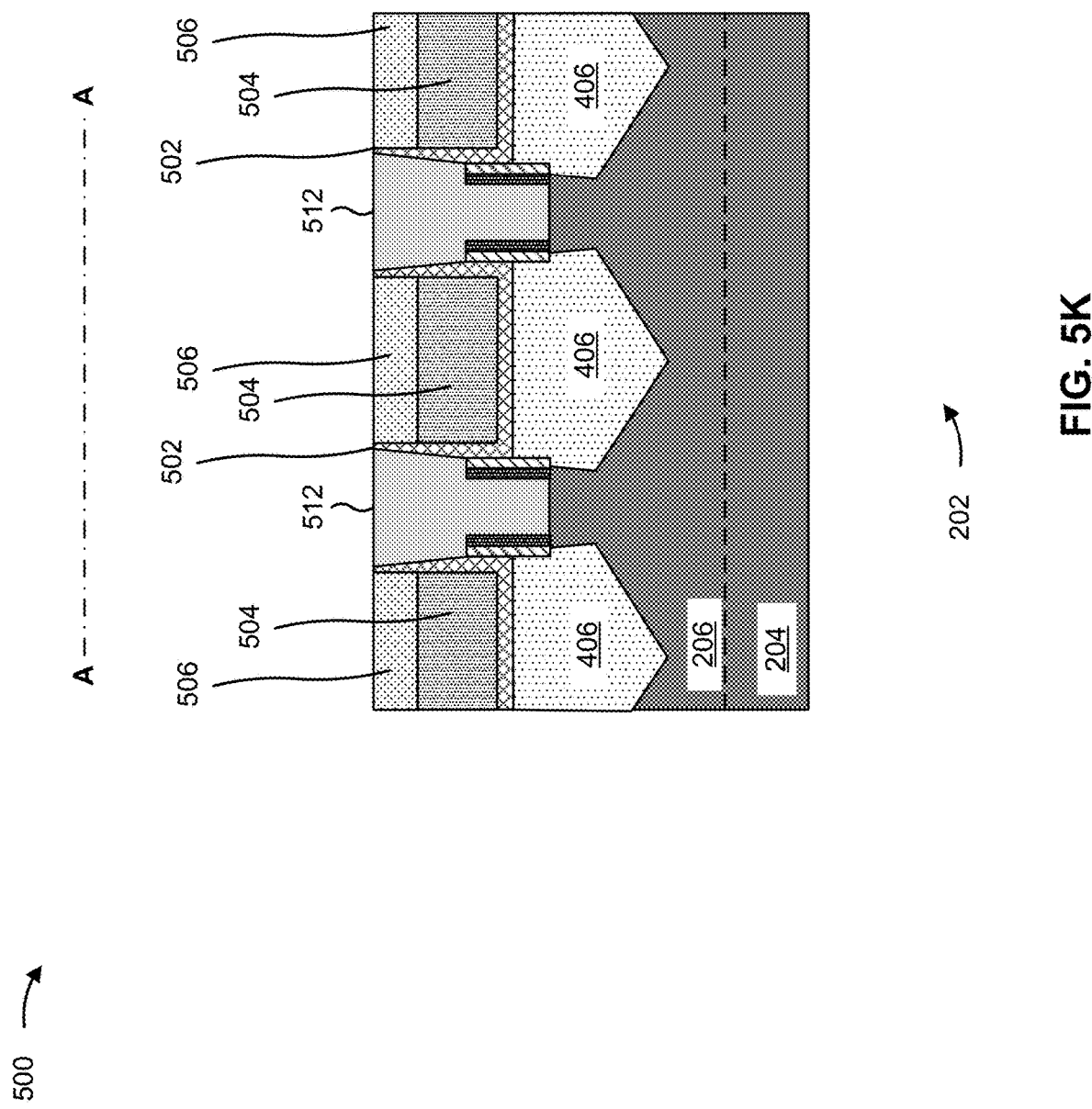
Figure 5L:
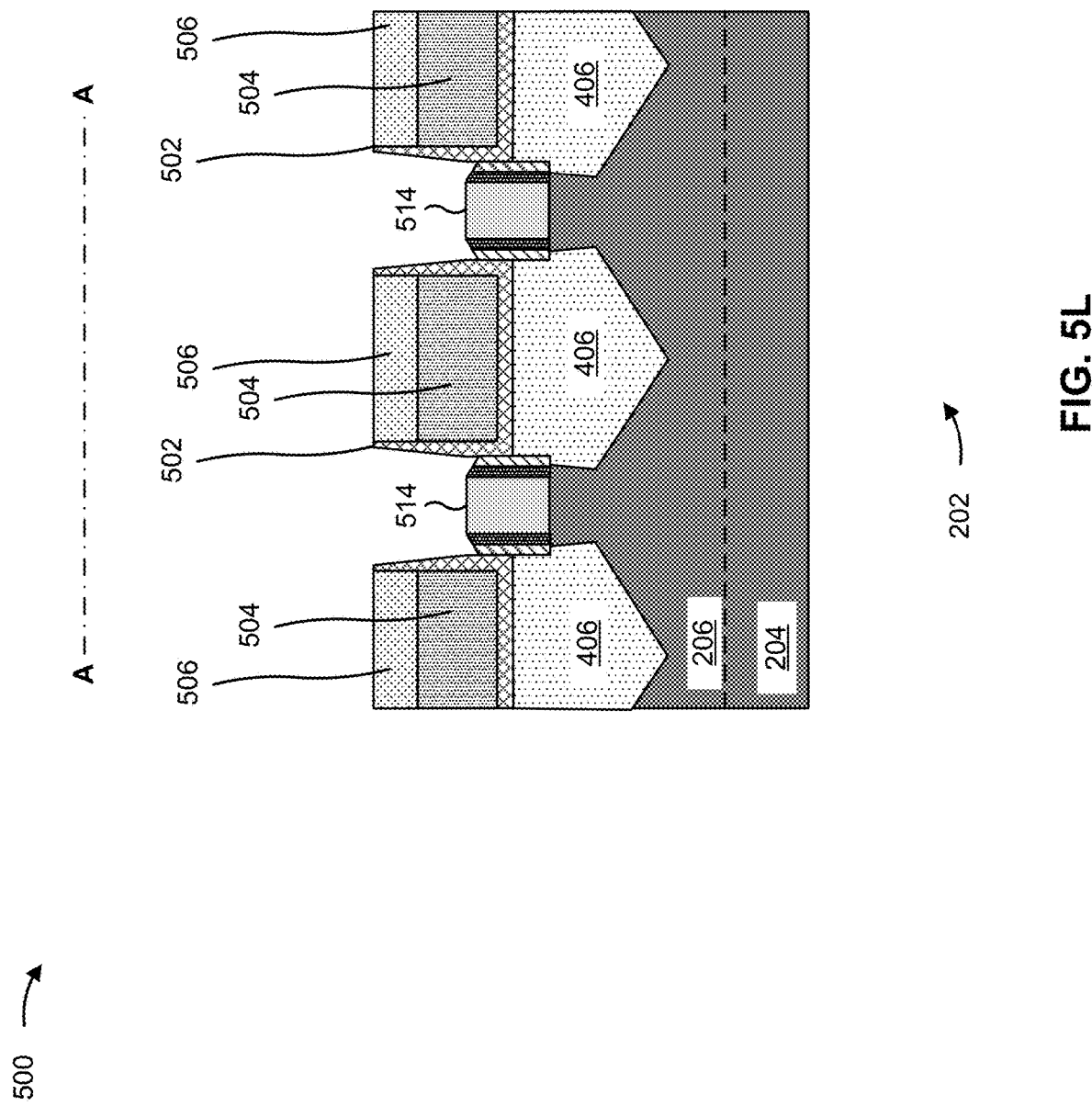
Figure 5M:
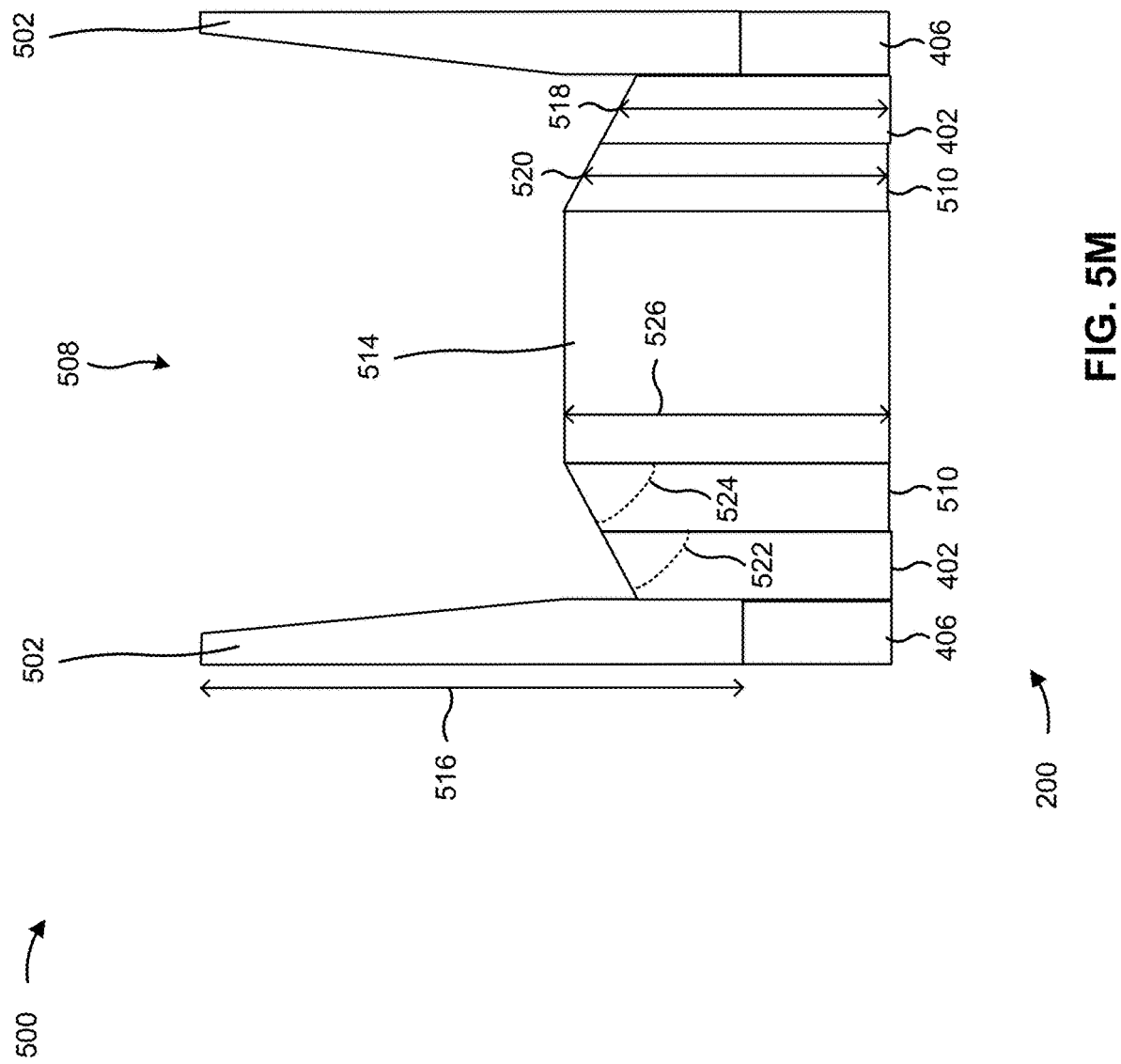
Figure 5N:
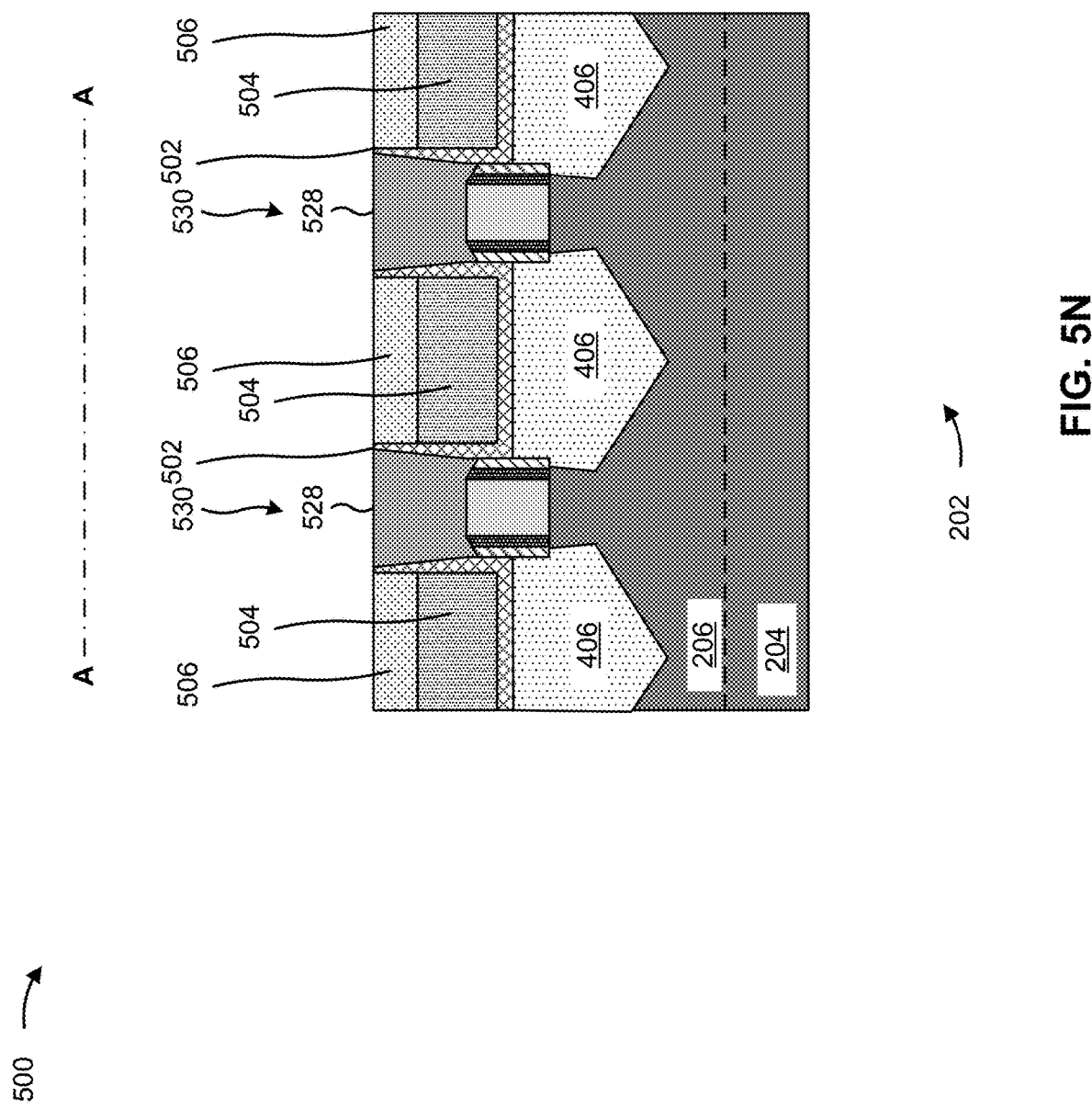
Figure 5O:
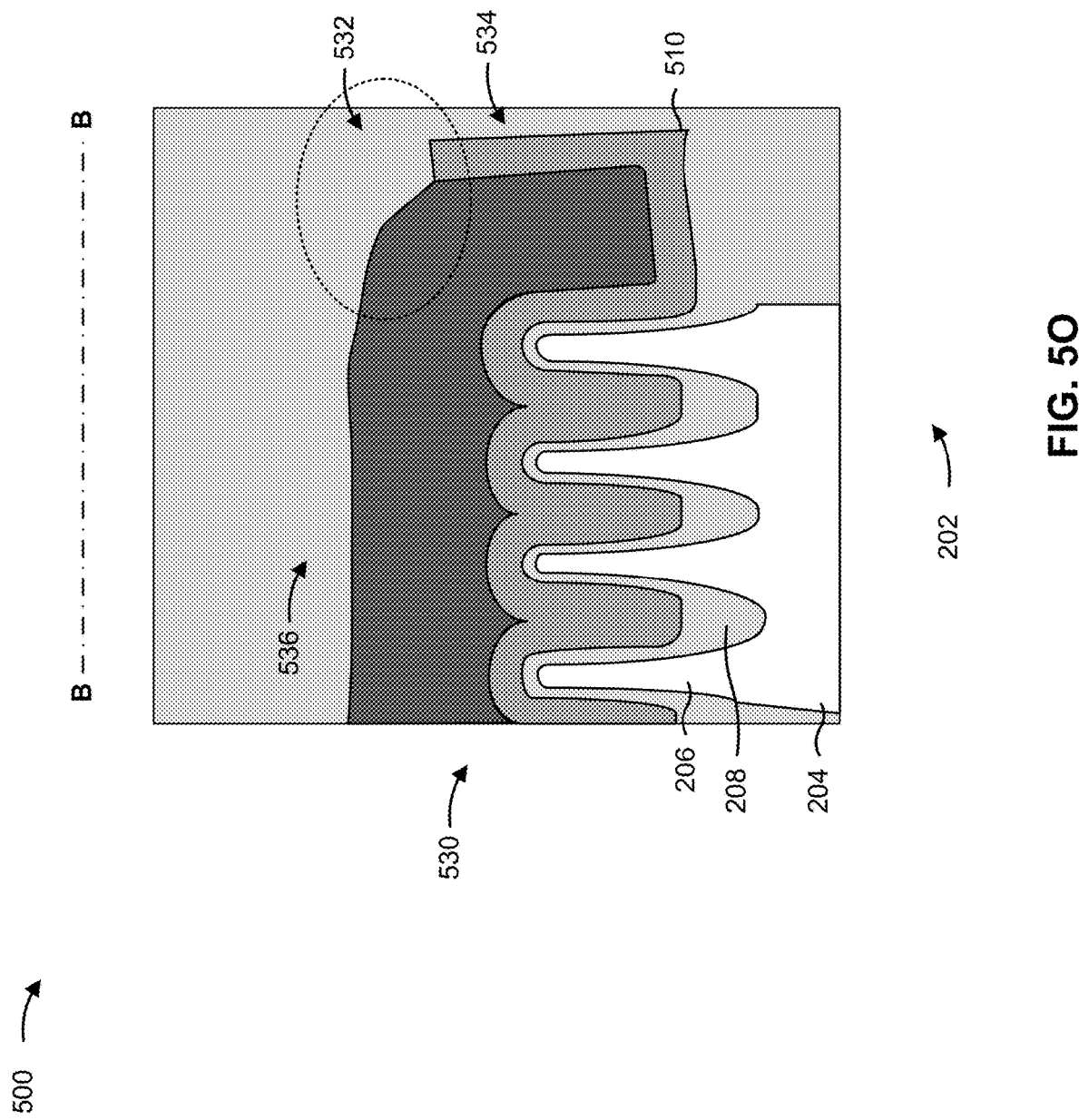

FIGS. 5A-5O are diagrams of an example implementation 500 described herein. The example implementation 500 includes an example dummy gate replacement process (also referred to as a replacement gate process (RGP)), in which the dummy gate structures 210 (which may be polysilicon (PO) based) are replaced with replacement gate structures that include high-k gate structures and/or metal gate structures, among other examples. FIGS. 5A-5O are illustrated from the perspective of the cross-sectional plane A-A in FIG. 2 for the device region 202.

As shown in FIG. 5A, a contact etch stop layer (CESL) 502 is conformally deposited (e.g., by the deposition tool 102) over the source/drain regions 406, over the dummy gate structures 210, and on the sidewalls of the spacer layers 402. The CESL 502 may provide a mechanism to stop an etch process when forming contacts or vias for the device region 202. The CESL 502 may be formed of a dielectric material having a different etch selectivity from adjacent layers or components. The CESL 502 may include or may be a nitrogen containing material, a silicon containing material, and/or a carbon containing material. Furthermore, the CESL 502 may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL 502 may be deposited using a deposition process, such as ALD, CVD, or another deposition technique. In some implementations, the CESL 502 is formed to a thickness in a range of approximately 50 nanometers to approximately 90 nanometers. However, other values for the thickness are within the scope of the present disclosure.

As shown in FIG. 5B, an interlayer dielectric (ILD) layer 504 is formed (e.g., by the deposition tool 102) over and/or on the CESL 502. The ILD layer 504 fills in the areas between the dummy gate structures 210 over the source/drain regions 406. The ILD layer 504 is formed to permit a replacement gate structure process to be performed in the device region 202, in which a metal gate structure is formed to replace one or more of the dummy gate structures 210. The ILD layer 504 may be referred to as an ILD zero (ILD0) layer.

In some implementations, the ILD layer 504 is formed to a height (or thickness) such that the ILD layer 504 covers the dummy gate structures 210. In these implementations, a subsequent CMP operation (e.g., performed by the planarization tool 110) is performed to planarize the ILD layer 504 such that a top surface of the ILD layer 504 is approximately at a same height as the top surfaces of the dummy gate structures 210. This increases the uniformity of the ILD layer 504.

As shown in FIG. 5C, the planarization tool 110 performs a planarization operation (e.g., a CMP operation) to planarize or polish the semiconductor device 200. The planarization operation results in removal of material from the hard mask layer 216, the spacer layers 402, the CESL 502, the ILD layer 504, and/or another layer. The planarization operation may be performed to expose the top surfaces of the dummy gate structures 210. The planarization operation may be referred to as an ILD0 oxide polish operation.

As shown in FIG. 5D, a portion of the ILD layer 504 is removed to form recesses in the ILD layer 504. The removal of the portion of the ILD layer 504 may be referred to as a CO recess operation. In some implementations, a pattern in a photoresist layer is used to remove the portion of the ILD layer 504. In these implementations, the deposition tool 102 forms the photoresist layer on the ILD layer 504 and on the dummy gate structures 210. The exposure tool 104 exposes the photoresist layer to a radiation source to pattern the photoresist layer. The developer tool 106 develops and removes portions of the photoresist layer to expose the pattern. The etch tool 108 etches into the ILD layer 504 to remove the portion of the ILD layer 504. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique to remove the portion of the ILD layer 504. In some implementations, the portion of the ILD layer 504 is removed based on a difference in etch selectivity (e.g., without a photoresist layer) between the materials of the dummy gate structures 210 and the materials of the ILD layer 504.

In some implementations, one or more operations may be performed for the semiconductor device 200 between the planarization operation and the CO recess operation. For example, one or more operations may be performed to form one or more gate isolation regions in the semiconductor device 200. The gate isolation region(s) (which may also be referred to as cut gate regions, cut polysilicon regions, or cut poly regions, among other examples) may be formed to separate the dummy gate structures 210 into shorter or smaller portions of the dummy gate structures 210 so that individual or isolated replacement gate structures may be formed for respective transistors of the semiconductor device 200 when a gate replacement process is performed.

The one or more operations to form the gate isolation region(s) may include a cut polysilicon (CPO) operation and a continuous poly on oxide definition edge (CPODE) operation, among other examples. The CPO operation includes the etch tool 108 etching one or more portions of the dummy gate structures 210 to form openings or recesses in the dummy gate structures 210. The deposition tool 102 may deposit a dielectric material in the recesses or openings to form the gate isolation region(s). The dielectric material may include, for example, a silicon oxide ($SiO_x$), a silicon nitride ($Si_xN_y$), a silicon oxynitride (SiON), fluoride-doped silicate glass (FSG), a low-k dielectric material, and/or another suitable insulating material. The CPODE operation includes the etch tool 108 etching one or more portions of the dummy gate structures 210 and the fin structure 206 to form a trench.

The deposition tool 102 may deposit a dielectric material in the trench to form a horizontally-orientated capacitor. The dielectric material may include, for example, a silicon oxide ($SiO_x$), a silicon nitride ($Si_xN_y$), a silicon oxynitride (SiON), fluoride-doped silicate glass (FSG), a low-k dielectric material, and/or another suitable insulating material.

As shown in FIG. 5E, the recesses in the ILD layer 504 are filled with a capping layer 506. The deposition tool 102 deposits the capping layer 506 using a CVD technique, a PVD technique, an ALD technique, another deposition technique described above in connection with FIG. 1, and/or a deposition technique other than as described above in connection with FIG. 1. The deposition tool 102 may over-fill the recesses such that the capping layer 506 is initially formed to a height or thickness that is greater relative to the height of the top surfaces of the dummy gate structures 210. Accordingly, the planarization tool 110 may then perform a planarization operation to planarize or polish the capping layer 506 such that the height of a top surface of the capping layer 506 and the height of the top surfaces of the dummy gate structures 210 are approximately equal.

The capping layer 506 may be formed of a dielectric material. The dielectric material may include, for example, a silicon oxide ($SiO_x$), a silicon nitride ($Si_xN_y$), a silicon oxynitride (SiON), fluoride-doped silicate glass (FSG), a low-k dielectric material, and/or another suitable material. The dielectric material of the capping layer 506 and the material of the dummy gate structures 210 may be different to provide a difference in etch selectivity between the capping layer 506 and the dummy gate structures 210.

As shown in FIG. 5F, portions of the gate electrode layers 214 of the dummy gate structures 210 are removed in a polysilicon removal (PORM) operation. In some implementations, the etch tool 108 etches the gate electrode layers 214 to remove portions of the gate electrode layers 214 of the dummy gate structures 210 based on the difference in etch selectivity between the capping layer 506 and the gate electrode layers 214. Alternatively, a pattern in a hard mask or a photoresist layer may be formed, and the etch tool 108 may etch the gate electrode layers 214 based on the pattern.

As shown in FIG. 5G, portions of the spacer layers 402 are removed. In some implementations, the etch tool 108 etches the spacer layers 402 to remove the portions of the spacer layers 402. In some implementations, the spacer layers 402 are etched such that a height of top surfaces of the spacer layers 402 and top surfaces (e.g., heights) of the gate electrode layers 214 are approximately equal. In some implementations, top surfaces of the gate electrode layers 214 may be curved, dished, or concave as a result of the PORM operation. The gate electrode layers 214 may also be etched along with the spacer layers 402 to flatten the top surfaces of the spacer layers 402. In this way, the top surfaces of the gate electrode layers 214 and the spacer layers 402 are approximately flat and smooth between the CESL 502, as shown in the example in FIG. 5G.

The etch tool 108 may perform a plasma-based etch operation to etch the spacer layers 402 (and, in some implementations, the top surface of the gate electrode layers 214). The plasma-based etch operation may include a radical surface treatment (RST) in which a plasma is used to generate radicals. The radicals are used to etch the material of the spacer layers 402. The radicals may include, for example, fluorine (F) radicals, fluorine-containing radicals, hydrous radicals, nitrogen/hydrogen radicals, sulfur hydrogen radicals, and/or another type of radicals. The radicals may be generated by using the plasma to excite a gas mixture including a nitrogen fluoride ($NF_x$ such as $NF_3$), oxygen ($O_2$), and/or another gas. In some implementations, a quartz filter may be used to facilitate generation of radicals (e.g., fluorine ion radicals) from the gas mixture. In this way, the radicals are generated and provided to the semiconductor device 200 to achieve a high etch selectively for the material of the spacer layers 402 (e.g., a silicon nitride ($Si_xN_y$) or another suitable material) relative to other materials of the semiconductor device 200.

The plasma may include a nitrogen-based ($N_2$) plasma, a hydrogen-based ($H_2$) plasma, an argon-based (Ar) plasma and/or another type of plasma. The plasma may be generated by inductive coupling, capacitive coupling, transformer coupling, and/or another plasma generation technique. The pressure for the RST operation may be in a range of approximately 0.005 Torr to approximately 10 Torr. However, other values for the pressure are within the scope of the present disclosure. The temperature for the RST operation may be in a range of approximately 300 degrees Celsius to approximately 500 degrees Celsius. However, other values for the temperature are within the scope of the present disclosure. The radio frequency (RF) power for the plasma may be included in a range of approximately 100 watts to approximately 200 watts. However, other values for the RF power are within the scope of the present disclosure.

As further shown in FIG. 5G, the etch tool 108 may etch portions of the CESL 502 (e.g., portions of the CESL 502 in the openings 508) in the plasma-based etch operation. The portions of the CESL 502 may be etched to tune or configure a particular profile for the CESL 502 in the openings 508. The plasma-based etch operation may be used to tune or configure a bottom profile (or bottom width) for dielectric capping layers that are to be formed in the openings 508 in a subsequent operation, and/or to tune or configure a top profile (or top width) for dielectric capping layers that are to be formed in the openings 508 in a subsequent operation. Etching of the portions of the CESL 502 in the openings 508 results in the CESL 502 being angled or tapered between the top surfaces of the gate electrode layers 214 and top surfaces of the CESL 502, as shown in the example in FIG. 5G. This results in a funnel (or tapered) profile for the opening 508, which may enable formation of tapered or angled dielectric capping layers in the openings 508, which may increase the gap filling performance (e.g., with reduced void formation, reduced discontinuity formation, reduced delamination) in one or more subsequent deposition operations to form the dielectric capping layers.

As shown in FIG. 5H, the remaining portions of the gate electrode layers 214 are removed from the openings 508. The removal of the remaining portions of the gate electrode layers 214 exposes the gate dielectric layers 212. In some implementations, the etch tool 108 etches the gate electrode layers 214 to remove the remaining portions of the gate electrode layers 214 based on the difference in etch selectivity between the gate electrode layers 214 and the other layers and/or structures of the semiconductor device 200. Alternatively, a pattern in a hard mask or a photoresist layer may be formed, and the etch tool 108 may etch the gate electrode layers 214 based on the pattern.

As shown in FIG. 5I, the gate dielectric layers 212 are removed from the openings 508. The removal of the remaining portions of the gate electrode layers 214 exposes portions of the fin structure 206 in the openings 508. In some implementations, the etch tool 108 etches the gate dielectric layers 212 to remove the gate dielectric layers 212 based on the difference in etch selectivity between the gate dielectric layers 212 and the other layers and/or structures of the semiconductor device 200. Alternatively, a pattern in a hard mask or a photoresist layer may be formed, and the etch tool 108 may etch the gate dielectric layers 212 based on the pattern. In some implementations, a photoresist layer is formed over a first portion of the semiconductor device 200 so that a second portion of the semiconductor device 200 may be processed (e.g., an input/output (I/O) area) without affecting the first area. In some implementations, a descum operation (e.g., an I/O descum) may be performed to remove residual material from the gate dielectric layers 212 prior to removal of the gate dielectric layers 212.

As shown in FIG. 5J, work function metal (WFM) layers 510 are formed in the openings 508. The work function metal layers 510 are included for turning the work function of the transistors of the semiconductor device 200. Particular materials and/or particular combinations of materials may be selected for the work function metal layers 510 to tune the work function of the transistors. For example, particular materials and/or particular combinations of materials may be selected for p-type (e.g., p-type metal-oxide semiconductor (PMOS) transistors such that the work function is adjusted to be close to the valence band of the material (e.g., silicon (Si) or another semiconducting material) of the fin structure 206. As another example, particular materials and/or particular combinations of materials may be selected for n-type (e.g., n-type metal-oxide semiconductor (NMOS) transistors such that the work function is adjusted to be close to the conduction band of the material of the fin structure 206. In some implementations, different work function metal materials are used for PMOS transistors and for NMOS transistors included in the semiconductor device 200. Examples of materials for the work function metal layers 510 include titanium nitride (TiN), tantalum nitride, (TaN), ruthenium (Ru), molybdenum (Mo), aluminum (Al), tungsten nitride (WN), zirconium silicide ($ZrSi_x$), molybdenum silicide ($MoSi_x$), tantalum silicide ($TaSi_x$), nickel silicide ($NiSi_x$), titanium (Ti), gold (Ag), and/or tantalum aluminum (TaAl), among other examples.

The deposition tool 102 and/or the plating tool 112 deposits the work function metal layers 510 on the sidewalls of the spacer layers 402 in the openings 508. In some implementations, the deposition tool 102 and/or the plating tool 112 deposits a plurality of work function metal layers 510 on one or more of the spacer layers 402. The plurality of work function metal layers 510 on a spacer layer 402 may include the same material or different materials. The deposition tool 102 and/or the plating tool 112 deposits the work function metal layers 510 using a CVD technique, a PVD technique, an ALD technique, an electroplating technique, another deposition technique described above in connection with FIG. 1, and/or a deposition technique other than as described above in connection with FIG. 1. In some implementations, the work function metal layers 510 are formed on the fin structure 206 at the bottom of the openings 508. In some implementations, the work function metal layers 510 are formed on the sidewalls in the openings 508 and subsequently etched (e.g., by the etch tool 108) to a height that is approximately equal to the height of the spacer layers 402.

As further shown in FIG. 5J, the work function metal layers 510 may be formed such that the height of top surfaces of the work function metal layers 510 is approximately the same as the height of the top surfaces of the spacer layers 402 in the openings 508. In some implementations, the work function metal layers 510 are formed such that the height of the top surfaces of the work function metal layers 510 is greater than the height of the top surfaces of the spacer layers 402 in the openings 508. The height of the top surfaces of the work function metal layers 510 being approximately equal to or greater than the height of the top surfaces of the spacer layers 402 increases the likelihood that the work function metal layers 510 will be fully covered by a capping layer that is to be formed on a metal gate (MG) structure that is to be formed in the openings 508. Both the top surfaces of the spacer layers 402 and the top surfaces of the work function metal layers 510 may be lower or lesser relative to the height of top surfaces of the CESL 502, which further increases the likelihood that the work function metal layers 510 will be fully covered by a capping layer that is to be formed on a metal gate structure that is to be formed in the openings 508.

As shown in FIG. 5K, the openings 508 are filled with a conductive material 512. In some implementations, the deposition tool 102 and/or the plating tool 112 deposits the conductive material 512 in the openings 508. The conductive material 512 includes a metallic material (or metal alloy), a high-k material, and/or another type of conductive material. Examples of the metallic material include cobalt (Co), tungsten (W), ruthenium (Ru), molybdenum (Mo), titanium (Ti), titanium nitride (TiN), another metallic material, and/or a combination thereof. In some implementations, the deposition tool 102 and/or the plating tool 112 over-fills the openings 508 with the conductive material 512 (e.g., to ensure that the openings 508 are fully filled with the conductive material). The planarization tool 110 may perform a planarization operation to planarize or polish the conductive material 512 such that a height of a top surface of the conductive material 512 is approximately even with tops of the openings 508.

As shown in FIG. 5L, an etching operation is performed to etch back the conductive material 512 to form metal gate (MG) layers 514 between the work function metal layers 510. The etch tool 108 may perform the etching operation using a suitable etching technique. The etching operation may be referred to as a metal gate etch back (MGEB) operation.

In some implementations, the conductive material 512 is etched back such that a height of top surfaces of the metal gate layers 514 and the height of the top surfaces of the work function metal layers 510 are approximately a same height. In some implementations, the spacer layers 402 and the work function metal layers 510 are etched in the MGEB operation such that the height of top surfaces of the metal gate layers 514 is greater relative to the height of the top surfaces of the work function metal layers 510 and the height of the top surfaces of the spacer layers 402. In these implementations, etching of the spacer layers 402 and the work function metal layers 510 results in a downward and outward slope of the spacer layers 402 and the work function metal layers 510. In other words, the top surfaces of the spacer layers 402 and the top surfaces of the work function metal layers 510 are sloped or angled downward from the metal gate layers 514 to the CESL 502. This downward and outward slope reduces, minimizes, and/or prevents the likelihood of an antenna defect forming in the transistors of the semiconductor device 200, which might otherwise occur if the top surfaces of the spacer layers 402 and the top surfaces of the work function metal layers 510 were sloped in an upward and outward manner. This reduces the likelihood of over etching of the metal gate layers 514 in subsequent semiconductor processing operations, which reduces the likelihood of an MG missing defect occurring in the semiconductor device 200.

FIG. 5M illustrates a plurality of dimensions of a plurality of layers and/or structures of the semiconductor device 200.

As shown in FIG. 5M, an example dimension 516 includes a height of the CESL 502. In some implementations, the height of the CESL 502 is in a range of approximately 50 nanometers to approximately 90 nanometers. However, other values for the height of the CESL 502 are within the scope of the present disclosure.

As further shown in FIG. 5M, an example dimension 518 includes a height of the spacer layers 402 in the opening 508. In some implementations, the height of the spacer layers 402 is in a range of approximately 10 nanometers to approximately 30 nanometers to achieve a sufficient height for a metal gate layer 514. However, other values for the height of the spacer layers 402 are within the scope of the present disclosure. Moreover, the height of the spacer layers 402 may be lesser relative to the height of the CESL 502 such that the top surfaces of the spacer layers 402 are lower relative to the top surfaces of the CESL 502. In some implementations, a ratio of the height of the CESL 502 to the height of the spacer layers 402 is in a range of approximately 5:3 to approximately 9:1. However, other values for the ratio are within the scope of the present disclosure.

As further shown in FIG. 5M, an example dimension 520 includes a height of the work function metal layers 510 in the opening 508. In some implementations, the height of the work function metal layers 510 is in a range of approximately 10 nanometers to approximately 30 nanometers to achieve a sufficient height for the metal gate layer 514. However, other values for the height of the work function metal layers 510 are within the scope of the present disclosure. Moreover, the height of the work function metal layers 510 may be lesser relative to the height of the CESL 502 such that the top surfaces of the work function metal layers 510 are lower relative to the top surfaces of the CESL 502. In some implementations, a ratio of the height of the CESL 502 to the height of the work function metal layers 510 is in a range of approximately 5:3 to approximately 9:1. However, other values for the ratio are within the scope of the present disclosure.

In some implementations, the height of the work function metal layers 510 and the height of the spacer layers 402 are approximately equal such that the top surfaces of the work function metal layers 510 and the top surfaces of the spacer layers 402 are at approximately the same height. In some implementations, the height of the work function metal layers 510 is greater than the height of the spacer layers 402 such that the top surfaces of the work function metal layers 510 is greater than the top surfaces of the spacer layers 402. The height of the top surfaces of the work function metal layers 510 being approximately equal to or greater than the height of the top surfaces of the spacer layer 402 increases the likelihood that the work function metal layers 510 are fully covered by a dielectric capping layer that is to be formed in the opening 508, which reduces the likelihood of metal gate missing (e.g., which can occur after gate contacts for the semiconductor device 200 are formed).

As further shown in FIG. 5M, an example dimension 522 includes an angle of the top surfaces of the spacer layers 402 relative to the sidewalls of the spacer layers 402. Moreover, an example dimension 524 includes an angle of the top surfaces of the work function metal layers 510 relative to the sidewalls of the work function metal layers 510. The angle of the top surfaces of the spacer layers 402 and the angle of the top surfaces of the work function metal layers 510 may be in a range of approximately 55 degrees to approximately 95 degrees such that the top surfaces of the spacer layers 402 and the top surfaces of the work function metal layer 510 are either substantially flat or angled downward toward the CESL 502. In some implementations, the angle of the top surfaces of the spacer layers 402 and the angle of the top surfaces of the work function metal layers 510 are in a range of approximately 55 degrees to less than approximately 90 degrees such that the top surfaces of the spacer layers 402 and the top surfaces of the work function metal layer 510 are angled downward toward the CESL 502. The top surfaces of the work function metal layers 510 being substantially flat (e.g., being approximately orthogonal to the sidewalls of the work function metal layers 510) or sloped downward and outward provides a geometry and/or a shape of the work function metal layers 510 that reduces, minimizes, and/or prevents the likelihood of the occurrence of an antenna defect in the transistors of the semiconductor device 200. However, other values for the angle are within the scope of the present disclosure. In some implementations, the difference between angles of work function metal layers 510 on opposing sides of the opening 508 is in a range of approximately 3 degrees to approximately 15 degrees. However, other values for the difference are within the scope of the present disclosure.

As further shown in FIG. 5M, an example dimension 526 includes a height or thickness of the metal gate layer 514 after the MGEB operation. In some implementations, the height or thickness of the metal gate layer 514 after the MGEB operation is in a range of approximately 30 nanometers to approximately 32 nanometers. However, other values for the height are within the scope of the present disclosure. In some implementations, the height of metal gate layer 514 is greater relative to the height of the work function metal layers 510 (e.g., the dimension 520) and/or the height of the spacer layers 402 (e.g., the dimension 518) as a result of the work function metal layers 510 and the spacer layers 402 being etched in the MGEB operation.

As shown in FIG. 5N, dielectric capping layers 528 are formed over and/or on the top surfaces of the spacer layers 402, over and/or on the top surfaces of the work function metal layers 510, and over and/or on the top surfaces of the metal gate layers 514. The deposition tool 102 deposits the dielectric capping layers 528 using a CVD technique, a PVD technique, an ALD technique, another deposition technique described above in connection with FIG. 1, and/or a deposition technique other than as described above in connection with FIG. 1. In some implementations, the deposition tool 102 over-fills the dielectric capping layers 528, and the planarization tool 110 performs a planarization operation to planarize or polish the dielectric capping layers 528 such that a height of top surfaces of the dielectric capping layers 528 are approximately even with the top surfaces of the CESL 502.

The combination of work function metal layers 510, a metal gate layer 514, and a dielectric capping layer 528 may be referred to as a replacement gate stack 530. The dielectric capping layer 528 may be referred to as a self-aligned cap (SAC) in that the dielectric capping layer 528 protects the replacement gate stack 530 from processing damage during processing of the semiconductor device 200. The dielectric capping layers 528 include a dielectric material such as a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

As further shown in FIG. 5N, the dielectric capping layers 528 fully cover the work function metal layers 510. The top surfaces of the work function metal layers 510 being substantially flat (e.g., being approximately orthogonal to the sidewalls of the work function metal layers 510) provides a geometry and/or a shape of the work function metal layers 510 that reduces, minimizes, and/or prevents charge trapping in the work function metal layers 510. This reduces, minimizes, and/or prevents the likelihood of the occurrence of the antenna defect in the transistors of the semiconductor device 200. Moreover, the height of the top surfaces of the work function metal layers 510 and the height of the top surfaces of the spacer layers 402 being approximately equal increases the likelihood that the work function metal layers 510 are fully covered by the dielectric capping layer 528, which reduces the likelihood of metal gate missing (e.g., which can occur after gate contacts for the semiconductor device 200 are formed).

FIG. 5O illustrates a cross-sectional view of the device region 202 of the semiconductor device 200 along the plane B-B in FIG. 2. As shown in FIG. 5O, a replacement gate stack 530 is formed over and wraps around portions of a plurality of fin structures 206. As further shown in FIG. 5O, the replacement gate stack 530 includes an angled portion 532 which is angled downward (or dips downward) at an end of the replacement gate stack 530 that is adjacent to a cut poly region 534. The angled portion 532 is at an end of a portion of the metal gate layer 514 closest to one of the plurality of work function metal layers 510. The downward angle provides a geometry and/or a shape of the replacement gate stack 530 that reduces, minimizes, and/or prevents the formation of an antenna defect in the replacement gate stack 530. This reduces, minimizes, and/or prevents the likelihood of the occurrence of MG etching during a contact or interconnect formation operation for the semiconductor device 200. In some implementations, a height difference between a height of top surface of the metal gate layer 514 in the angled portion 532 and a height of the top surface of the metal gate layer 514 in a non-angled portion 536 is in a range of approximately 17 nanometers to approximately 23 nanometers. However, other values for the height difference are within the scope of the present disclosure.

As indicated above, FIGS. 5A-5O are provided as an example. Other examples may differ from what is described with regard to FIGS. 5A-5O.

FIGS. 6A-6H are diagrams of an example implementation 600 described herein. The example implementation 600 includes an example of forming conductive structures (e.g., metal gate interconnects, source/drain contacts (MDs)) in the device region 202 of the semiconductor device 200. FIGS. 6A-6H are illustrated from the perspective of the cross-sectional plane A-A in FIG. 2 for the device region 202.

Figure 6A:
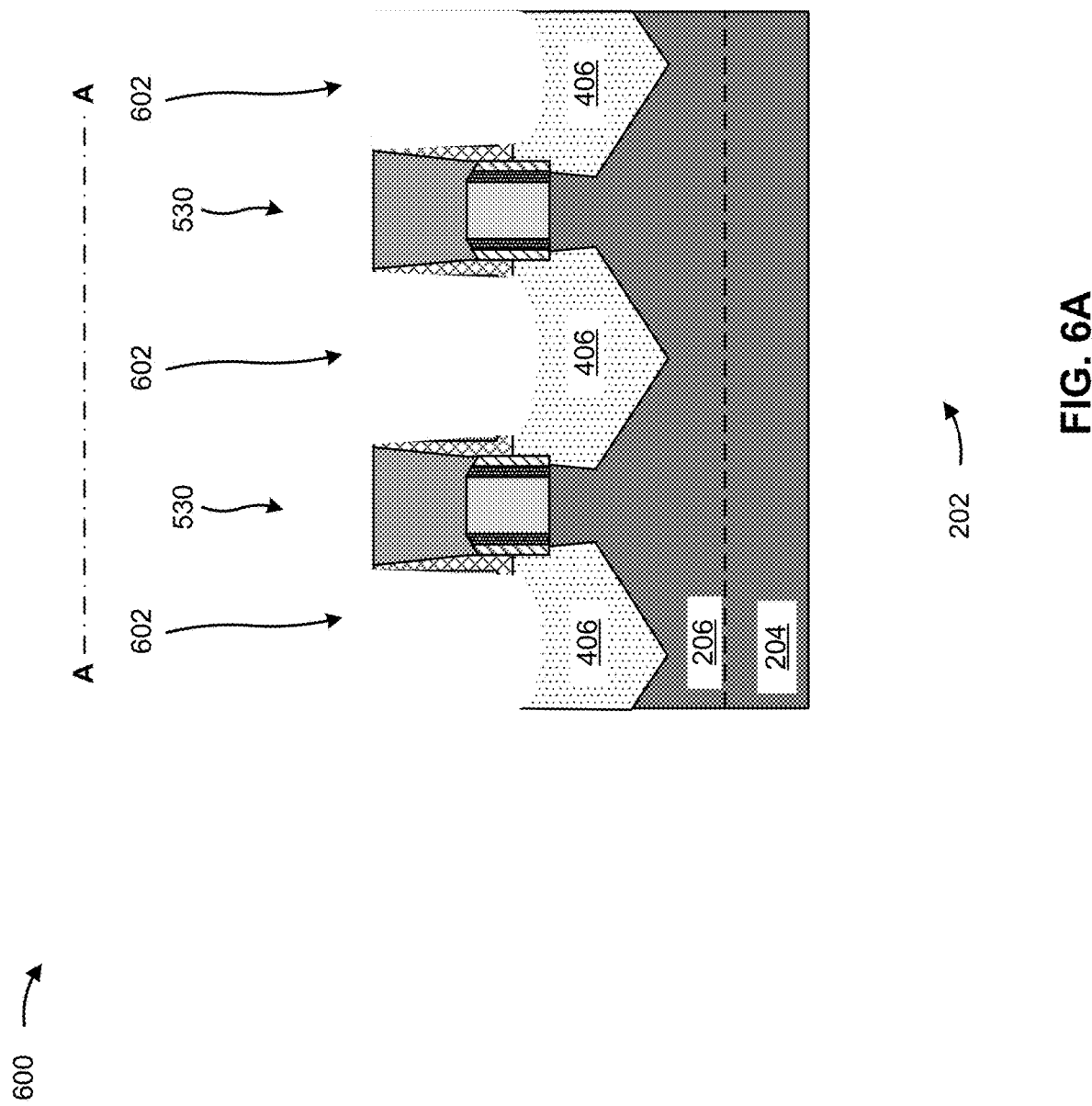

As shown in FIG. 6A, openings (or recesses) 602 are formed through one or more dielectric layers and to the source/drain regions 406. In particular, the CESL 502 and the ILD layer 504 between the replacement gate stacks 530 in the device region 202 are etched to form the openings 602 between the replacement gate stacks 530 and to the source/drain regions 406. In some implementations, the openings 602 are formed in a portion of the source/drain regions 406 such that recesses extend into a portion of the source/drain regions 406.

In some implementations, a pattern in a photoresist layer is used to form the openings 602. In these implementations, the deposition tool 102 forms the photoresist layer on the ILD layer 504, and on the replacement gate stacks 530. The exposure tool 104 exposes the photoresist layer to a radiation source to pattern the photoresist layer. The developer tool 106 develops and removes portions of the photoresist layer to expose the pattern. The etch tool 108 etches into the ILD layer 504 to form the openings 602. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 602 based on a pattern.

Figure 6B:
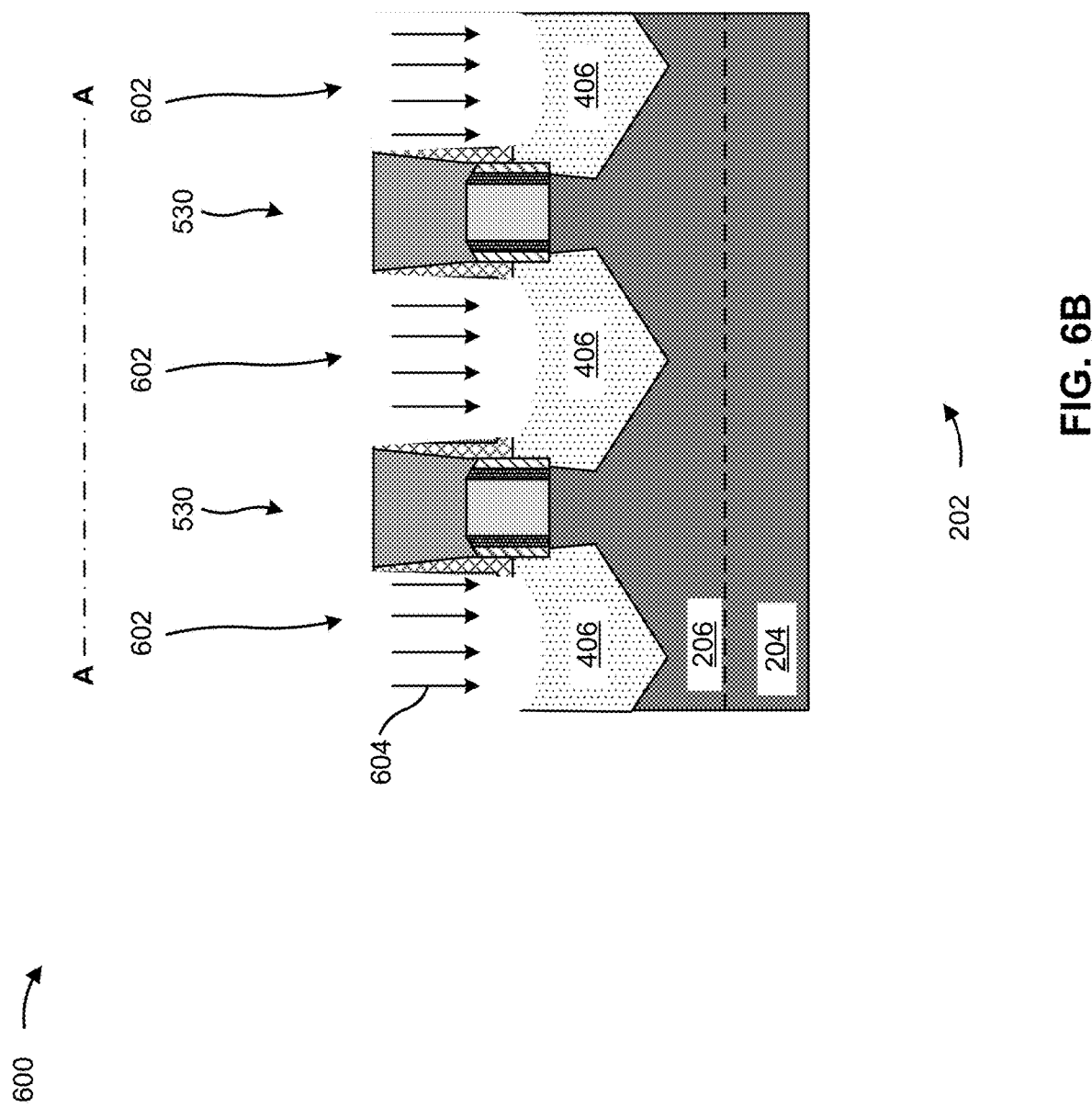

As shown in FIG. 6B, a pre-clean operation is performed to clean the surfaces in the openings 602. In particular, the semiconductor device 200 may be positioned in a first processing chamber of the deposition tool 102 (e.g., a pre-clean processing chamber), the first processing chamber may be pumped down to an at least partial vacuum (e.g., pressurized to a pressure that is included in a range of approximately 5 Torr to approximately 10 Torr, or to another pressure), and the bottom surfaces and the sidewalls in the openings 602 are cleaned using a plasma-based and/or a chemical-based pre-clean agent 604. The pre-clean operation is performed to clean (e.g., remove) oxides and other contaminants or byproducts from the top surfaces of source/drain regions 406 that may have formed after the formation of the openings 602.

Figure 6C:
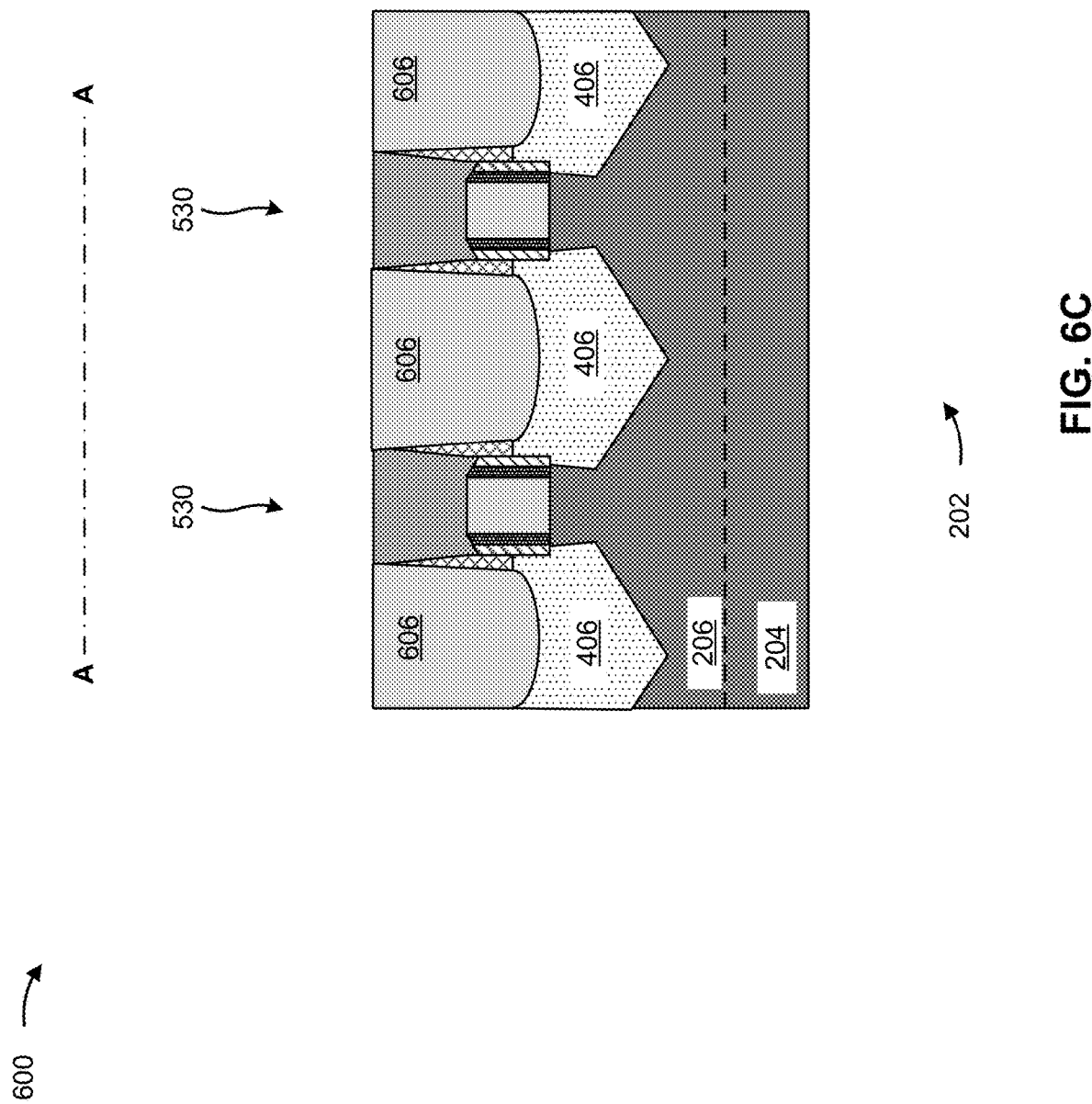

As shown in FIG. 6C, conductive structures 606 are formed in the device region 202. In particular, conductive structures 606 are formed in the openings 602 between the replacement gate stacks 530 and over the source/drain regions 406 in the openings 602. The deposition tool 102 and/or the plating tool 112 deposits the conductive structures 606 using a CVD technique, a PVD technique, an ALD technique, an electroplating technique, another deposition technique described above in connection with FIG. 1, and/or a deposition technique other than as described above in connection with FIG. 1. In some implementations, one or more additional layers are formed in the openings 602 prior to formation of the conductive structures 606. As an example, a metal silicide layer (e.g., titanium nitride (TiSi$_x$) or another metal silicide layer) may be formed on the top surfaces of the source/drain regions 406 prior to formation of the conductive structures 606. As another example, one or more barrier layers may be formed on the bottom surfaces and/or on the sidewalls in the openings 602 prior to formation of the conductive structures 606. As another example, one or more adhesion layers may be formed on the bottom surfaces and/or on the sidewalls in the openings 602 prior to formation of the conductive structures 606.

Figure 6D:
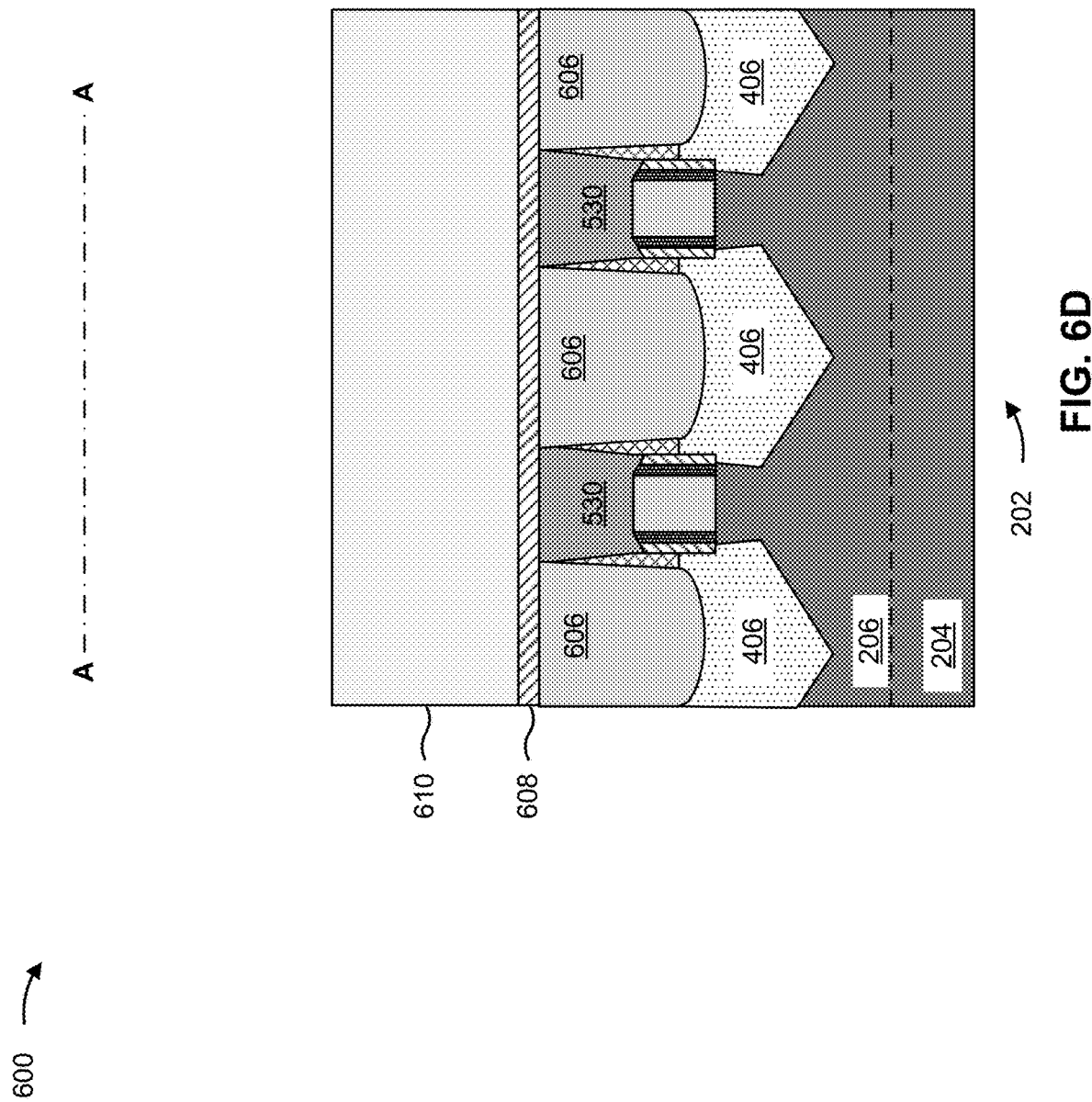

As shown in FIG. 6D, one or more layers may be formed in the device region 202 for the semiconductor device 200. The one or more layers may include an etch stop layer (ESL) 608 and a dielectric layer 610 (e.g., an ILD1 layer or an ILD2 layer). The deposition tool 102 may deposit the one or more layers using a CVD technique, a PVD technique, an ALD technique, another deposition technique described above in connection with FIG. 1, and/or a deposition technique other than as described above in connection with FIG. 1. The one or more layers may be included in a back end of line (BEOL) region of the semiconductor device 200. The one or more layers may be formed such that interconnects may be formed to the replacement gate stacks 530 and/or to the conductive structures 606.

Figure 6E:
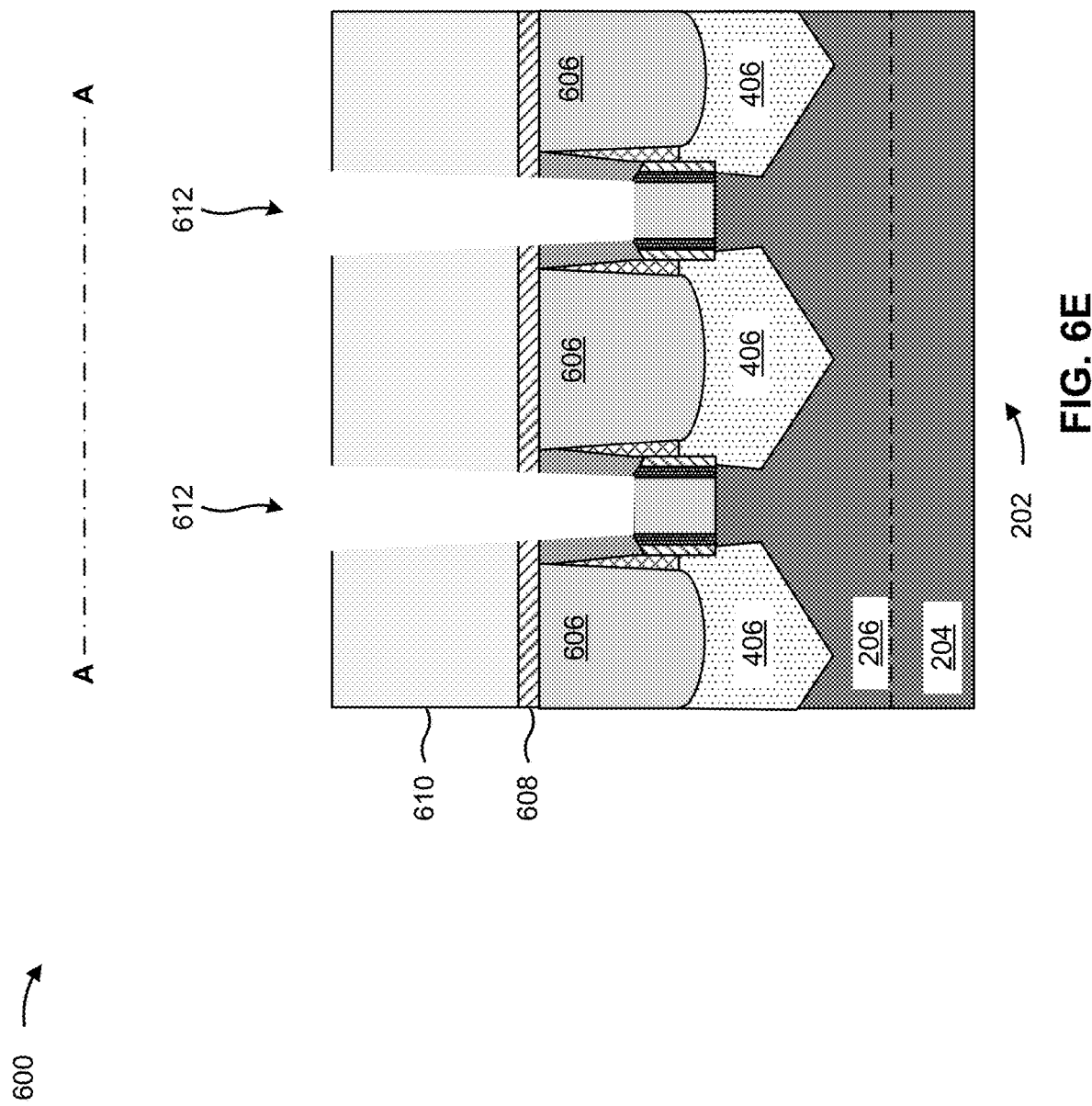

As shown in FIG. 6E, openings (or recesses) 612 are formed through the one or more layers and to the metal gate layers 514 of the replacement gate stacks 530. In some implementations, a pattern in a photoresist layer is used to form the openings 612. In these implementations, the deposition tool 102 forms the photoresist layer on the dielectric layer 610. The exposure tool 104 exposes the photoresist layer to a radiation source to pattern the photoresist layer. The developer tool 106 develops and removes portions of the photoresist layer to expose the pattern. The etch tool 108 etches through the dielectric layer 610, through the ESL 608, through the dielectric capping layers 528, and to the metal gate layers 514 to form the openings 612. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 612 based on a pattern.

As described herein, the approximately flat or downward and outward angle of the work function metal layers 510 and the spacer layers 402 reduce the likelihood of formation of antenna defects in the replacement gate stacks 530. In this way, the likelihood of MG missing defects due to over-etching of the metal gate layers 514 during formation of the openings 612 is reduced, which reduces the likelihood of defect formation and/or device failures in the semiconductor device 200.

Figure 6F:
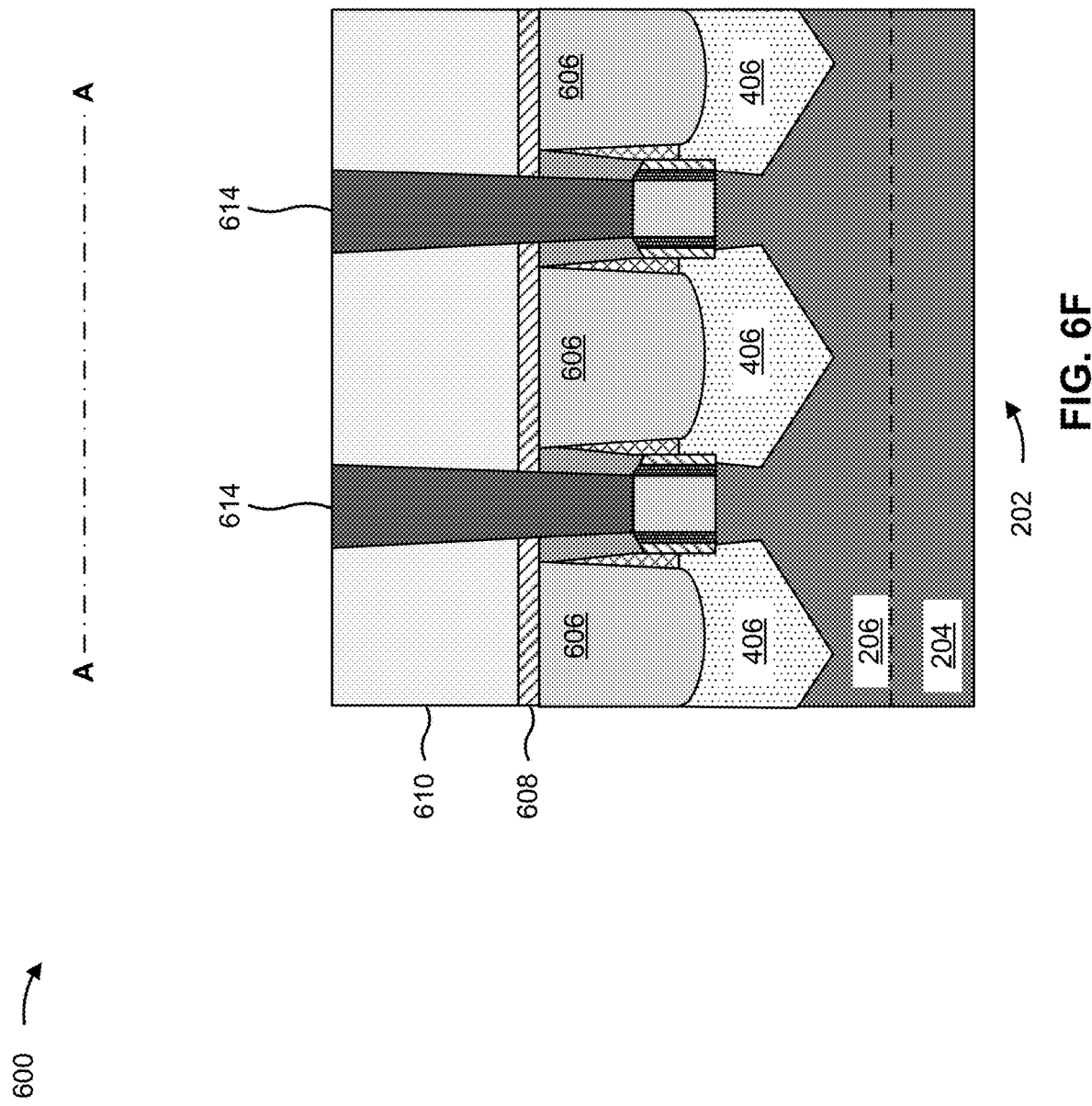

As shown in FIG. 6F, conductive structures 614 (e.g., metal gate interconnects or VGs) are formed in the device region 202. In particular, conductive structures 614 are formed in the openings 612 over the metal gate layers 514. The deposition tool 102 and/or the plating tool 112 deposits the conductive structures 614 using a CVD technique, a PVD technique, an ALD technique, an electroplating technique, another deposition technique described above in connection with FIG. 1, and/or a deposition technique other than as described above in connection with FIG. 1.

Figure 6G:
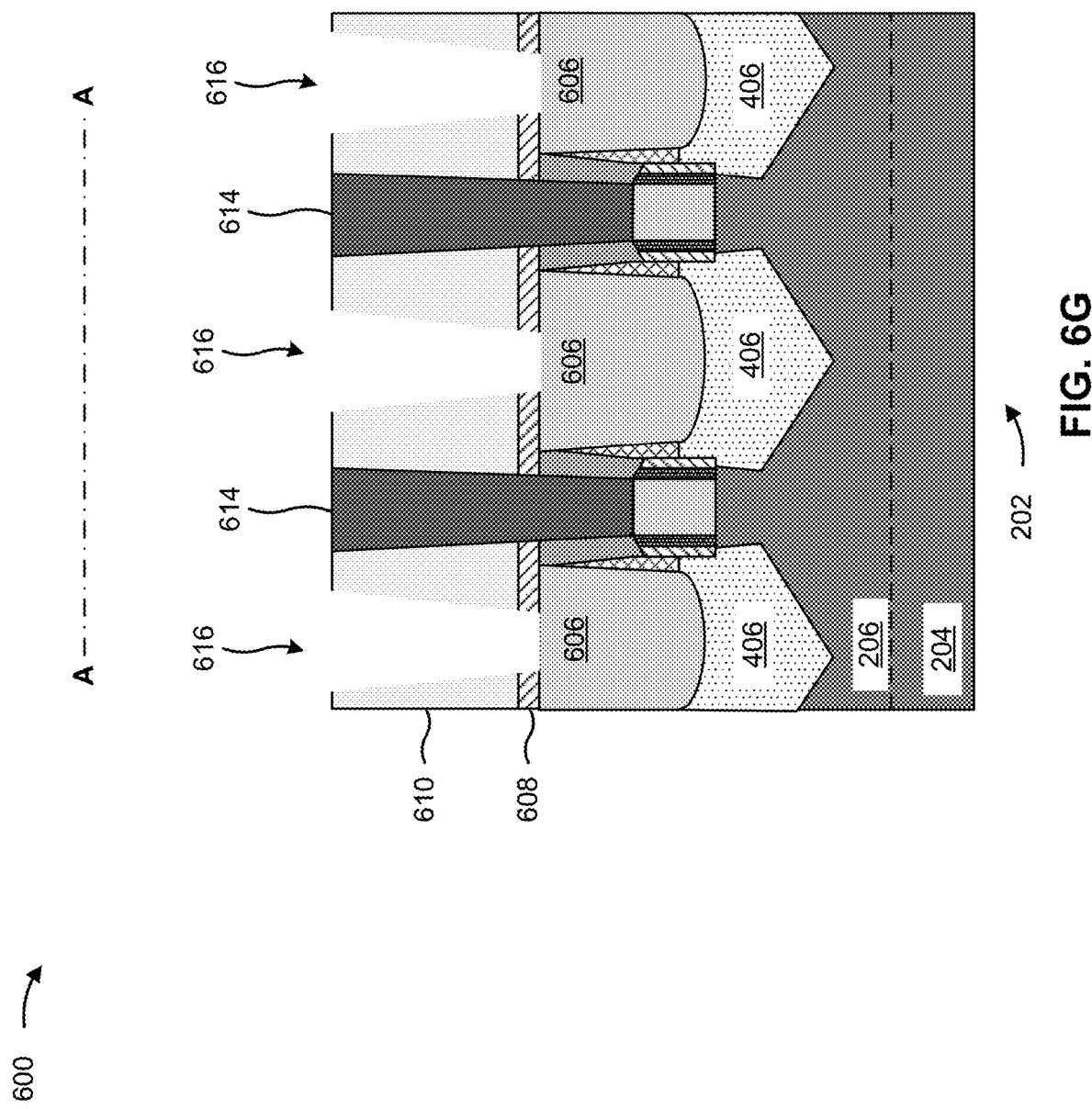

As shown in FIG. 6G, openings (or recesses) 616 are formed in and through the dielectric layer 610, in and through the ESL 608, and to the top surfaces of metal source/drain contacts 606. In some implementations, a pattern in a photoresist layer is used to form the openings 616. In these implementations, the deposition tool 102 forms the photoresist layer on the dielectric layer 610. The exposure tool 104 exposes the photoresist layer to a radiation source to pattern the photoresist layer. The developer tool 106 develops and removes portions of the photoresist layer to expose the pattern. The etch tool 108 etches into the dielectric layer 610 and into the ESL 608 to form the openings 616. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 616 based on a pattern.

Figure 6H:
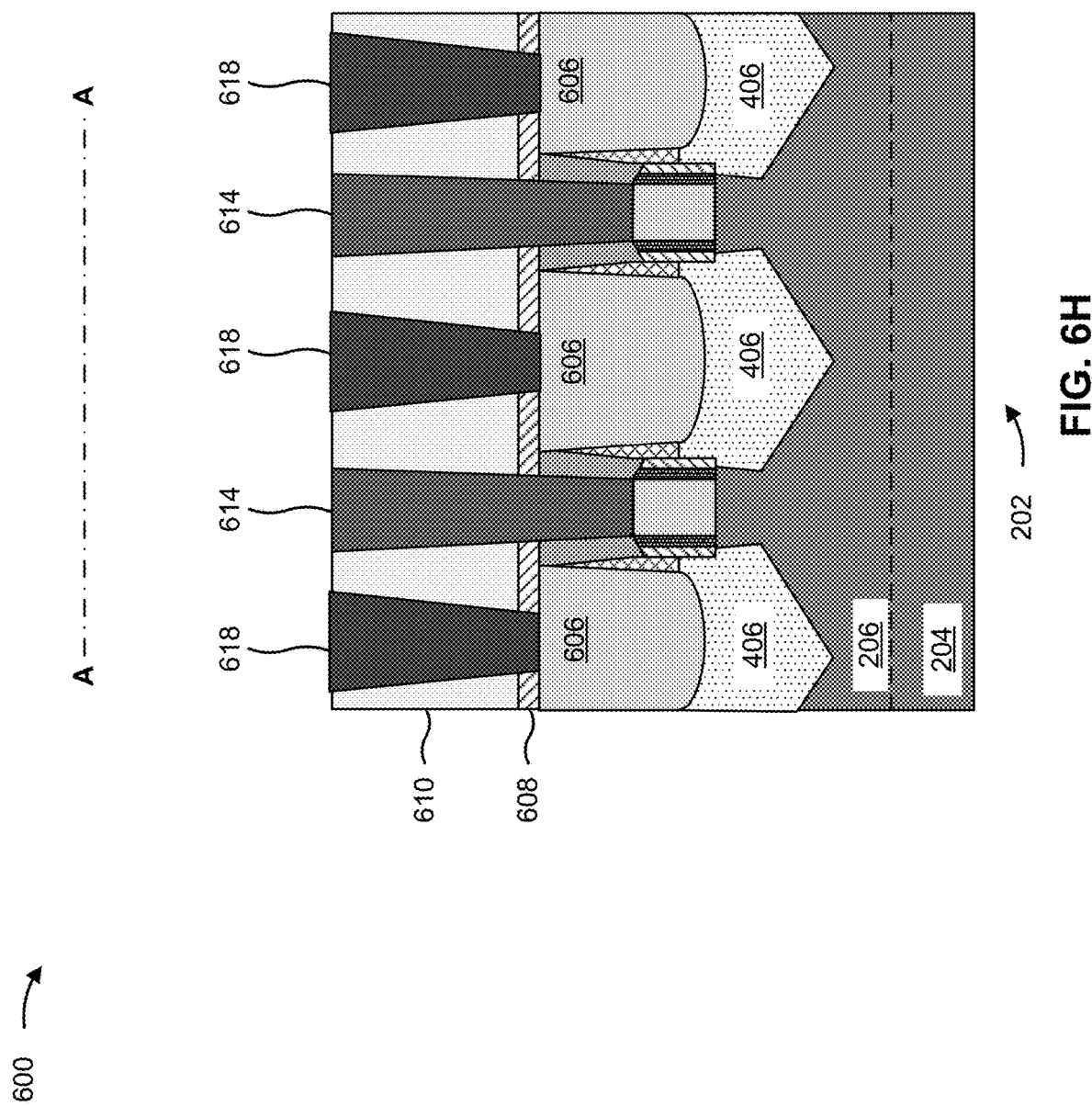

As shown in FIG. 6H, source/drain interconnects (via-to-source/drain or VDs) 618 (e.g., conductive structures) are formed in the openings 616 in the device region 202. In particular, the source/drain interconnects 618 are formed on the metal source/drain contacts 610 such that the source/ drain interconnects 618 and the metal source/drain contacts 606 are electrically and physically connected. The deposition tool 102 and/or the plating tool 112 deposits the source/drain interconnects 618 using a CVD technique, a PVD technique, an ALD technique, an electroplating technique, another deposition technique described above in connection with FIG. 1, and/or a deposition technique other than as described above in connection with FIG. 1. The deposition tool 102 fills the openings 616 with a conductive material to form the source/drain interconnects 618.

The source/drain interconnects 618 include ruthenium (Ru) metal source/drain contacts, tungsten (W) metal source/drain contacts, cobalt (Co) metal source/drain contacts, or metal source/drain contacts formed of another metal. In some implementations, the source/drain interconnects 618 and the metal source/drain contacts 606 include the same type of material such as ruthenium (Ru). In these implementations, the source/drain interconnects 618 and the metal source/drain contacts 606 include a homogeneous conductive material, which reduces and/or minimizes the occurrence of solid solutioning between the source/drain interconnects 618 and the metal source/drain contacts 606, reduces the occurrence of galvanic corrosion between the source/drain interconnects 618 and the metal source/drain contacts 606, and/or reduces the occurrence of phase transitioning in the source/drain interconnects 618 and the metal source/drain contacts 606. This reduces contact resistance between the source/drain interconnects 618 and the metal source/drain contacts 606, reduces surface roughness of the source/drain interconnects 618 and the metal source/drain contacts 606, and/or reduces separation of the source/drain interconnects 618 and the metal source/drain contacts 606, among other examples. In other implementations, the source/drain interconnects 618 and the metal source/drain contacts 606 include different conductive materials.

As indicated above, FIGS. 6A-6H are provided as an example. Other examples may differ from what is described with regard to FIGS. 6A-6H.

Figure 7:
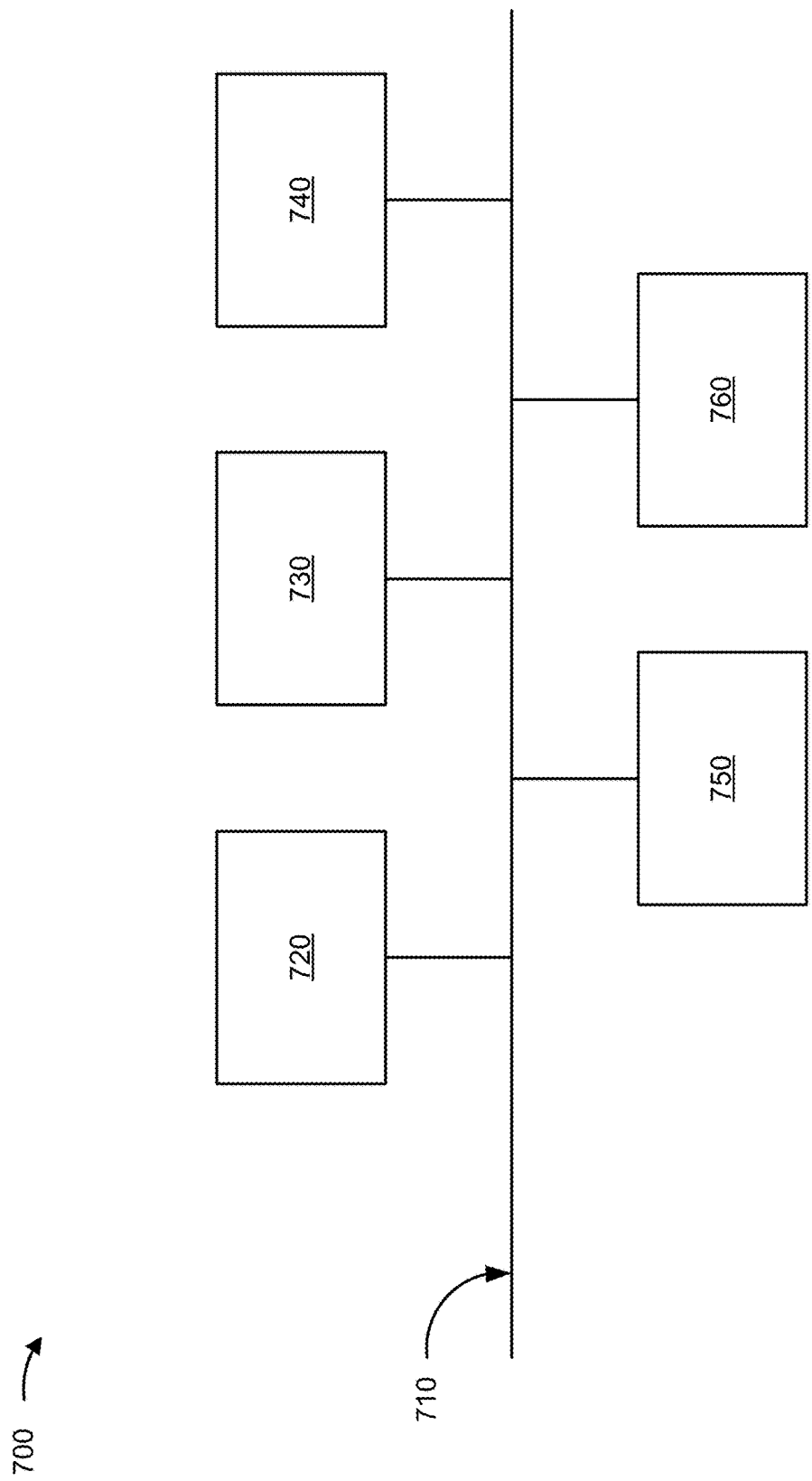
FIG. 7 is a diagram of example components of one or more devices of FIG. 1 described herein.

FIG. 7 is a diagram of example components of a device 700. In some implementations, one or more of the semiconductor processing tools 102-112 and/or the wafer/die transport tool 114 may include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
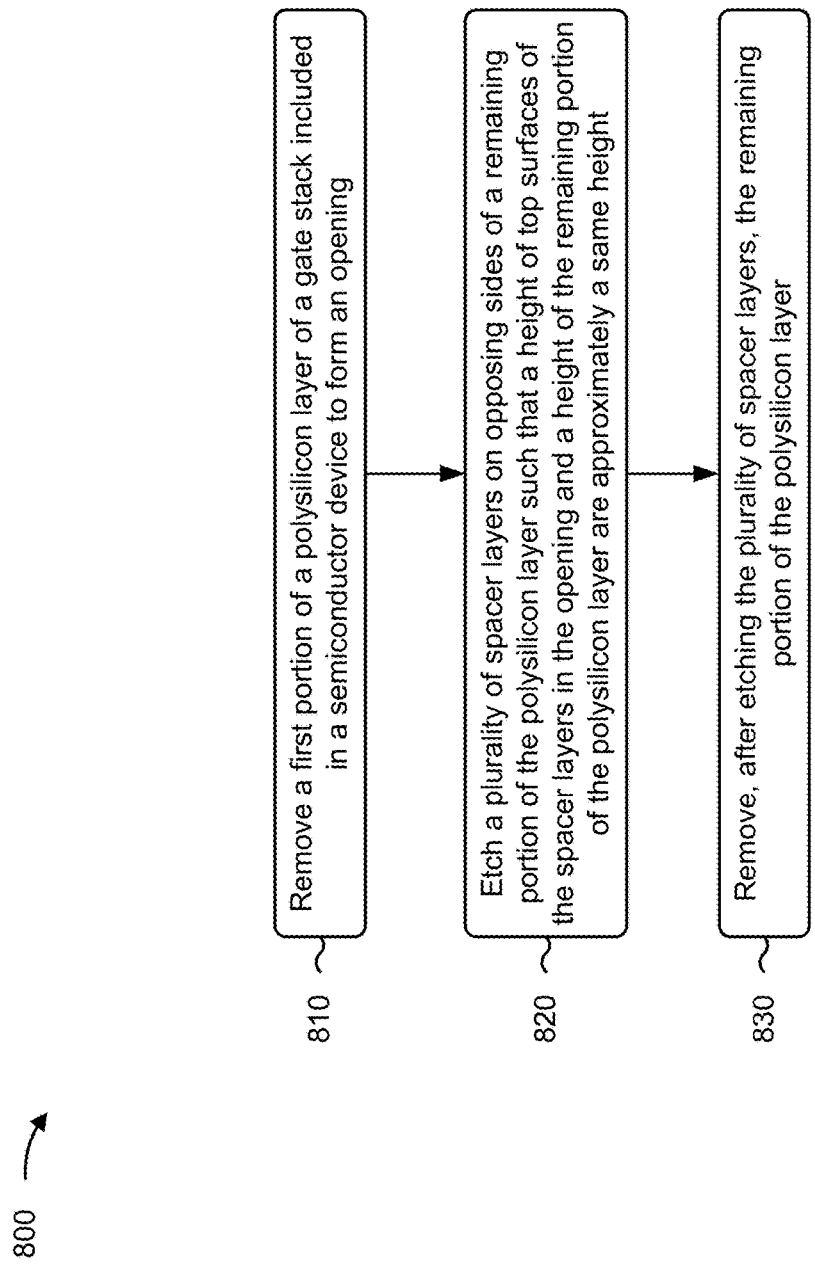
FIGS. 8 and 9 are flowcharts of example processes associated with forming a semiconductor device.

FIG. 8 is a flowchart of an example process 800 associated with forming a semiconductor device. In some implementations, one or more process blocks of FIG. 8 are performed by one or more of the semiconductor processing tools (e.g., one or more of the semiconductor processing tools 102-112). Additionally, or alternatively, one or more process blocks of FIG. 8 may be performed by one or more components of device 700, such as processor 720, memory 730, input component 740, output component 750, and/or communication component 760.

As shown in FIG. 8, process 800 may include removing a first portion of a polysilicon layer of a gate stack included in a semiconductor device to form an opening (block 810). For example, one or more of the semiconductor processing tools 102-112 may remove a first portion of a polysilicon layer, a gate electrode layer 214) of a gate stack (e.g., a dummy gate structure 210) included in a semiconductor device 200 to form an opening 508, as described herein.

As further shown in FIG. 8, process 800 may include etching a plurality of spacer layers on opposing sides of a remaining portion of the polysilicon layer such that a height of top surfaces of the spacer layers in the opening and a height of the remaining portion of the polysilicon layer are approximately a same height (block 820). For example, one or more of the semiconductor processing tools 102-112 may etch a plurality of spacer layers 402 on opposing sides of a remaining portion of the polysilicon layer such that a height of top surfaces of the spacer layers 402 in the opening 508 and a height of the remaining portion of the polysilicon layer are approximately a same height, as described herein.

As further shown in FIG. 8, process 800 may include removing, after etching the plurality of spacer layers, the remaining portion of the polysilicon layer (block 830). For example, one or more of the semiconductor processing tools 102-112 may remove, after etching the plurality of spacer layers 402, the remaining portion of the polysilicon layer, as described herein.

Process 800 may include additional implementations, such as any single implementation or any combination of implementations described below and/or in connection with one or more other processes described elsewhere herein.

In a first implementation, process 800 includes forming, after removing the remaining portion of the polysilicon layer, a plurality of work function metal layers 510 on sidewalls of the plurality of spacer layers 402 in the opening, and forming a metal gate layer 514 between the plurality of work function metal layers 510 in the opening. In a second implementation, alone or in combination with the first implementation, forming the metal gate layer 514 includes filling the opening 508 with a conductive material 512, and removing a portion of the conductive material 512 from the opening 508, where a remaining portion of the conductive material 512 in the opening 508 includes the metal gate layer 514, and removing the portion of the conductive material 512 from the opening 508 results in top surfaces of the plurality of work function metal layers 510 including a downward slope from the metal gate layer 514 to the plurality of spacer layers 402.

In a third implementation, alone or in combination with one or more of the first and second implementations, removing the portion of the conductive material 512 from the opening 508 includes etching the plurality of work function metal layers 510, while removing the portion of the conductive material 512 from the opening, such that a height (e.g., the dimension 526) of the metal gate layer 514 is greater relative to a height (e.g., the dimension 520) of the plurality of work function metal layers 510. In a fourth implementation, alone or in combination with one or more of the first through third implementations, removing the portion of the conductive material 512 from the opening 508 includes etching the plurality of spacer layers 402, while removing the portion of the conductive material 512 from the opening 508, such that a height (e.g., the dimension 526) of the metal gate layer 514 is greater relative to a height (e.g., the dimension 518) of the plurality of spacer layers 402.

In a fifth implementation, alone or in combination with one or more of the first through fourth implementations, process 800 includes forming an opening 612 through a plurality of dielectric layers (e.g., an ESL 608, a dielectric layer 610), through a self-aligned cap (SAC) (e.g., a capping layer 528) and to the metal gate layer 514, where the downward slope of the top surfaces of the plurality of work function metal layers 510 from the metal gate layer 514 to the plurality of spacer layers 402 reduces a likelihood of etching of the metal gate layer 514 during formation of the opening 612. In a sixth implementation, alone or in combination with one or more of the first through fifth implementations, an angle of the downward slope is in a range of approximately 55 degrees to less than approximately 90 degrees.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Figure 9:
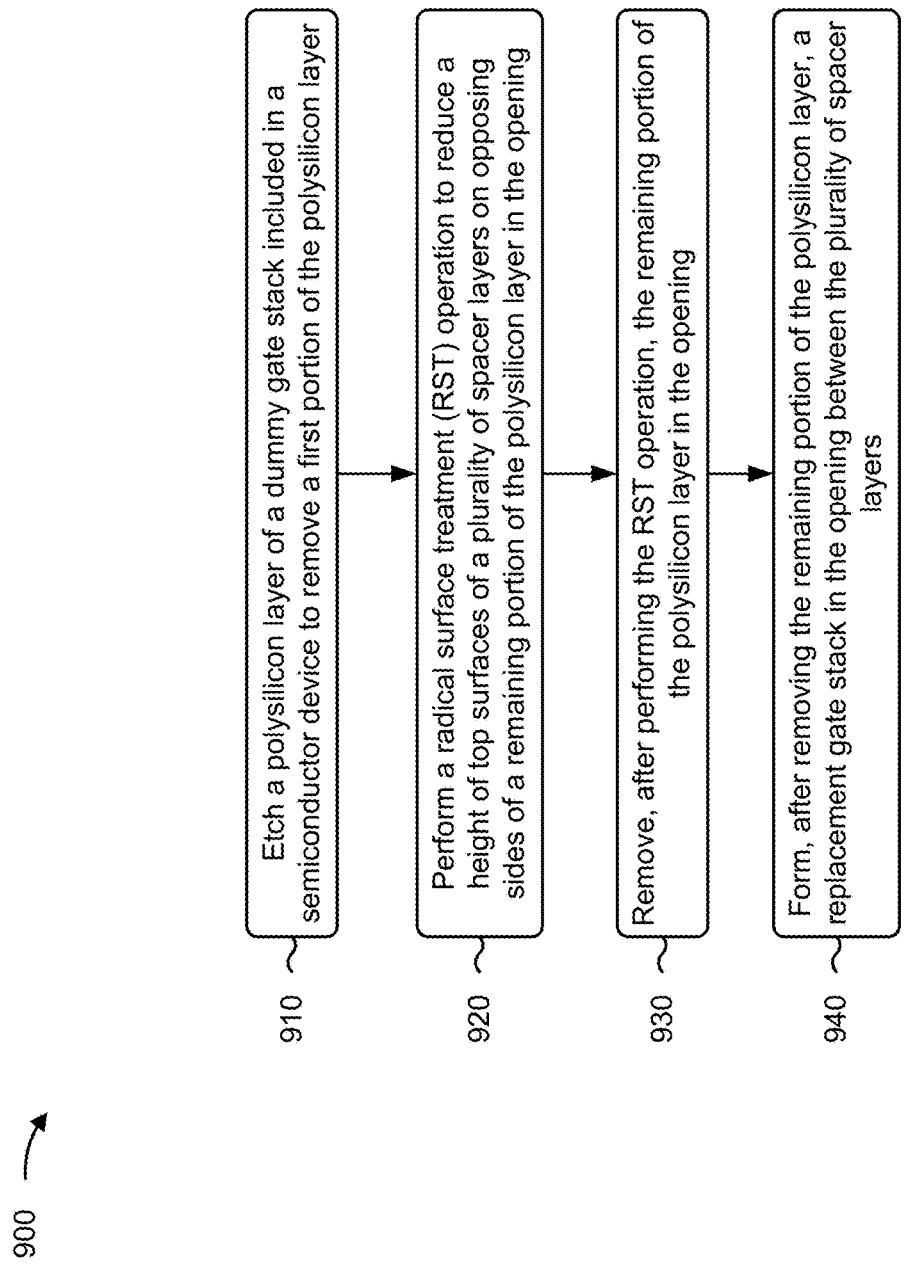

FIG. 9 is a flowchart of an example process 900 associated with forming a semiconductor device. In some implementations, one or more process blocks of FIG. 9 are performed by one or more of the semiconductor processing tools (e.g., one or more of the semiconductor processing tools 102-112). Additionally, or alternatively, one or more process blocks of FIG. 9 may be performed by one or more components of device 700, such as processor 720, memory 730, input component 740, output component 750, and/or communication component 760.

As shown in FIG. 9, process 900 may include etching a polysilicon layer of a dummy gate stack included in a semiconductor device to remove a first portion of the polysilicon layer (block 910). For example, one or more of the semiconductor processing tools 102-112 may etch a polysilicon layer (e.g., a gate electrode layer 214) of a dummy gate stack (e.g., a dummy gate structure 210) included in a semiconductor device 200 to remove a first portion of the polysilicon layer, as described herein. In some implementations, etching the polysilicon layer results in formation of an opening 508.

As further shown in FIG. 9, process 900 may include performing a radical surface treatment (RST) operation to reduce a height of top surfaces of a plurality of spacer layers on opposing sides of a remaining portion of the polysilicon layer in the opening (block 920). For example, one or more of the semiconductor processing tools 102-112 may perform a radical surface treatment (RST) operation to reduce a height of top surfaces of a plurality of spacer layers 402 on opposing sides of a remaining portion of the polysilicon layer in the opening 508, as described herein.

As further shown in FIG. 9, process 900 may include removing, after performing the RST operation, the remaining portion of the polysilicon layer in the opening (block 930). For example, one or more of the semiconductor processing tools 102-112 may remove, after performing the RST operation, the remaining portion of the polysilicon layer in the opening 508, as described herein.

As further shown in FIG. 9, process 900 may include forming, after removing the remaining portion of the polysilicon layer, a replacement gate stack in the opening between the plurality of spacer layers (block 940). For example, the one or more of the semiconductor processing tools 102-112 may form, after removing the remaining portion of the polysilicon layer, a replacement gate stack 530 in the opening 508 between the plurality of spacer layers 402, as described herein.

Process 900 may include additional implementations, such as any single implementation or any combination of implementations described below and/or in connection with one or more other processes described elsewhere herein.

In a first implementation, forming the replacement gate stack 530 includes forming a plurality of work function metal layers 510 on sidewalls of the plurality of spacer layers 402 in the opening 508, forming a metal gate layer 514 between the plurality of work function metal layers 510 in the opening 508, and forming a capping layer 528 over the metal gate layer 514, over the work function metal layers 510, and over the plurality of spacer layers 402 in the opening. In a second implementation, alone or in combination with the first implementation, forming the plurality of work function metal layers 510 includes forming the plurality of work function metal layers 510 such that a height of top surfaces of the plurality of work function metal layers 510 and the height of the top surfaces of the plurality of spacer layers 402 are approximately equal.

In a third implementation, alone or in combination with one or more of the first and second implementations, performing the RST operation results in etching of a contact etch stop layer (CESL) 502 on opposing sides of the opening 508, which results in a tapered profile for the opening 508 between top surfaces of the CESL 502 and top surfaces of the spacer layers 402. In a fourth implementation, alone or in combination with one or more of the first through third implementations, performing the RST operation includes generating a plasma, using the plasma to generate radicals from a gas mixture, and etching the plurality of spacer layers 402 using the radicals.

In a fifth implementation, alone or in combination with one or more of the first through fourth implementations, the radicals include fluorine radicals, and where using the plasma to generate the radicals from the gas mixture includes using the plasma to generate the fluorine radicals from a nitrogen fluoride ($NF_x$) included in the gas mixture. In a sixth implementation, alone or in combination with one or more of the first through fifth implementations, process 900 includes using a quartz filter to facilitate generation of the radicals.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

In this way, spacer layers on sidewalls of a dummy gate structure included in a semiconductor device are trimmed or etched prior to or during an RGP in which the dummy gate structure is replaced with a replacement gate structure (e.g., a metal gate structure or a high-k gate structure). An RST operation is performed to etch the spacer layers, which is a type of plasma treatment in which radicals are generated using a plasma. The radicals in the plasma are used to etch the spacer layers such that the shape and/or the geometry of the remaining portions of the spacer layers reduces, minimizes, and/or prevents the likelihood of an antenna defect being formed in the spacer layers and/or in a work function metal layer of the replacement gate structure. This reduces, minimizes, and/or prevents the likelihood of occurrence of damage and/or defects in the replacement gate structure in subsequent processing operations for the semiconductor device.

As described in greater detail above, some implementations described herein provide a method. The method includes removing a first portion of a polysilicon layer of a gate stack included in a semiconductor device to form an opening. The method includes etching a plurality of spacer layers on opposing sides of a remaining portion of the polysilicon layer such that a height of top surfaces of the spacer layers in the opening and a height of the remaining portion of the polysilicon layer are approximately a same height. The method includes removing, after etching the plurality of spacer layers, the remaining portion of the polysilicon layer.

As described in greater detail above, some implementations described herein provide a method. The method includes etching a polysilicon layer of a dummy gate stack included in a semiconductor device to remove a first portion of the polysilicon layer, where etching the polysilicon layer results in formation of an opening. The method includes performing a radical surface treatment (RST) operation to reduce a height of top surfaces of a plurality of spacer layers on opposing sides of a remaining portion of the polysilicon layer in the opening. The method includes removing, after performing the RST operation, the remaining portion of the polysilicon layer in the opening. The method includes forming, after removing the remaining portion of the polysilicon layer, a replacement gate stack in the opening between the plurality of spacer layers.

As described in greater detail above, some implementations described herein provide a semiconductor device. The semiconductor device includes a metal gate layer in between a plurality of etch stop layers. The semiconductor device includes a plurality of work function metal layers on opposing sides of the metal gate layer. The semiconductor device includes a plurality of spacer layers between the plurality of work function metal layers and the plurality of etch stop layers, where a height of top surfaces of the plurality of spacer layers is less than the height of the top surface of the metal gate layer. The semiconductor device includes a self-aligned cap over the metal gate layer, over the plurality of work function metal layers, and over the plurality of spacer layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   removing a first portion of a polysilicon layer of a gate stack included in a semiconductor device to form an opening;
   etching a plurality of spacer layers on opposing sides of a remaining portion of the polysilicon layer such that a height of top surfaces of the spacer layers in the opening and a height of the remaining portion of the polysilicon layer are approximately a same height;
   removing, after etching the plurality of spacer layers, the remaining portion of the polysilicon layer;
   forming, after removing the remaining portion of the polysilicon layer, a plurality of work function metal layers on sidewalls of the plurality of spacer layers in the opening; and
   forming a metal gate layer between the plurality of work function metal layers in the opening, wherein forming the metal gate layer comprises:
      filling, after forming the plurality of work function metal layers, the opening with a conductive material; and removing a portion of the conductive material from the opening, wherein a remaining portion of the conductive material in the opening corresponds to a metal gate layer between the plurality of work function metal layers in the opening, wherein removing the portion of the conductive material from the opening results in top surfaces of the plurality of work function metal layers including a downward slope from the metal gate layer to the plurality of spacer layers.

2. The method of claim 1, wherein removing the portion of the conductive material from the opening comprises:
etching the plurality of work function metal layers, while removing the portion of the conductive material from the opening, such that a height of the metal gate layer is greater relative to a height of the plurality of work function metal layers.

3. The method of claim 1, wherein removing the portion of the conductive material from the opening comprises:
etching the plurality of spacer layers, while removing the portion of the conductive material from the opening, such that a height of the metal gate layer is greater relative to a height of the plurality of spacer layers.

4. The method of claim 1, further comprising:
forming an opening through a plurality of dielectric layers, through a self-aligned cap and to the metal gate layer,
wherein the downward slope of the top surfaces of the plurality of work function metal layers from the metal gate layer to the plurality of spacer layers reduces a likelihood of etching of the metal gate layer during formation of the opening.

5. The method of claim 1, wherein an angle of the downward slope is in a range of approximately 55 degrees to less than approximately 90 degrees.

6. The method of claim 1, wherein a height of top surfaces of the spacer layers in the opening and a height of the remaining portion of the polysilicon layer are approximately a same height.

7. A method, comprising:
etching a polysilicon layer of a dummy gate stack included in a semiconductor device to remove a first portion of the polysilicon layer,
wherein etching the polysilicon layer results in formation of an opening;
performing a radical surface treatment (RST) operation to reduce a height of top surfaces of a plurality of spacer layers on opposing sides of a remaining portion of the polysilicon layer in the opening;
removing, after performing the RST operation, the remaining portion of the polysilicon layer in the opening;
forming, after removing the remaining portion of the polysilicon layer, a replacement gate stack in the opening between the plurality of spacer layers;
forming a plurality of work function metal layers on sidewalls of the plurality of spacer layers in the opening; and
forming a metal gate layer between the plurality of work function metal layers in the opening, wherein forming the metal gate layer results in top surfaces of the plurality of work function metal layers including a downward slope from the metal gate layer to the plurality of spacer layers.

8. The method of claim 7, wherein forming the replacement gate stack comprises:
forming a capping layer over the metal gate layer, over the work function metal layers, and over the plurality of spacer layers in the opening.

9. The method of claim 8, wherein forming the plurality of work function metal layers comprises:
forming the plurality of work function metal layers such that a height of top surfaces of the plurality of work function metal layers and the height of the top surfaces of the plurality of spacer layers are approximately equal.

10. The method of claim 7, wherein performing the RST operation results in etching of a contact etch stop layer (CESL) on opposing sides of the opening, which results in a tapered profile for the opening between top surfaces of the CESL and top surfaces of the spacer layers.

11. The method of claim 7, wherein performing the RST operation comprises:
generating a plasma;
using the plasma to generate radicals from a gas mixture; and
etching the plurality of spacer layers using the radicals.

12. The method of claim 11, wherein the radicals include fluorine radicals; and
wherein using the plasma to generate the radicals from the gas mixture comprises:
using the plasma to generate the fluorine radicals from a nitrogen fluoride ($NF_x$) included in the gas mixture.

13. The method of claim 12, further comprising:
using a quartz filter to facilitate generation of the radicals.

14. A method, comprising:
removing a first portion of a polysilicon layer of a gate stack included in a semiconductor device to form an opening;
reducing a height of top surfaces of a plurality of spacer layers on opposing sides of a remaining portion of the polysilicon layer in the opening;
removing, after reducing the height of the top surfaces of the plurality of spacer layers, the remaining portion of the polysilicon layer;
forming a plurality of work function metal layers on sidewalls of the plurality of spacer layers in the opening; and
forming a metal gate layer between the plurality of work function metal layers in the opening, wherein top surfaces of the plurality of work function metal layers are angled downward away from the metal gate layer.

15. The method of claim 14, further comprising:
forming a plurality of work function metal layers on sidewalls of the plurality of spacer layers in the opening.

16. The method of claim 15, wherein top surfaces of the plurality of work function metal layers are approximately orthogonal to sidewalls of the plurality of work function metal layers.

17. The method of claim 15, wherein the metal gate layer includes an angled portion at an end of a portion of the metal gate layer closest to one of the plurality of work function metal layers; and
wherein the angled portion is angled downward toward a cut polysilicon region of the semiconductor device.

18. The method of claim 14, further comprising:
forming a capping layer over the metal gate layer, over the work function metal layers, and over the plurality of spacer layers in the opening.

19. The method of claim 14, wherein a height of top surfaces of the plurality of work function metal layers and the height of the top surfaces of the plurality of spacer layers are approximately equal.

* * * * *